(12) United States Patent
Recoskie et al.

(10) Patent No.: US 11,387,507 B2
(45) Date of Patent: Jul. 12, 2022

(54) APPARATUS AND METHOD FOR INITIATING THERMAL RUNAWAY IN A BATTERY

(71) Applicant: NATIONAL RESEARCH COUNCIL OF CANADA, Ottawa (CA)

(72) Inventors: Steven Recoskie, Ottawa (CA); Dean MacNeil, Ottawa (CA); Giulio Torlone, Ottawa (CA); Oltion Kodra, Ottawa (CA); Joel Perron, Ottawa (CA)

(73) Assignee: National Research Council of Canada, Ottawa (CA)

(*) Notice: Subject to any disclaimer, the term of this patent is extended or adjusted under 35 U.S.C. 154(b) by 316 days.

(21) Appl. No.: 16/479,076

(22) PCT Filed: Jan. 18, 2018

(86) PCT No.: PCT/CA2018/050055
§ 371 (c)(1),
(2) Date: Jul. 18, 2019

(87) PCT Pub. No.: WO2018/132911
PCT Pub. Date: Jul. 26, 2018

(65) Prior Publication Data
US 2020/0036068 A1 Jan. 30, 2020

Related U.S. Application Data

(60) Provisional application No. 62/556,006, filed on Sep. 8, 2017, provisional application No. 62/448,134, filed on Jan. 19, 2017.

(51) Int. Cl.
*H01M 10/6571* (2014.01)
*H01M 10/42* (2006.01)
(Continued)

(52) U.S. Cl.
CPC .... *H01M 10/6571* (2015.04); *G01R 31/2849* (2013.01); *G01R 31/385* (2019.01); *H01M 10/4285* (2013.01); *H01M 10/486* (2013.01)

(58) Field of Classification Search
None
See application file for complete search history.

(56) References Cited

U.S. PATENT DOCUMENTS

| | | | |
|---|---|---|---|
| 5,574,355 | A | 11/1996 | McShane et al. |
| 8,059,007 | B2 | 11/2011 | Hermann et al. |

(Continued)

FOREIGN PATENT DOCUMENTS

| | | |
|---|---|---|
| CA | 2184578 C | 6/2000 |
| CA | 2531523 A1 | 1/2005 |

(Continued)

OTHER PUBLICATIONS

Darcy et al., "Cell Thermal Runaway Calorimeter", NASA-JSC, Advanced Automotive Battery Conference, Jun. 2017, 24 pages.
(Continued)

*Primary Examiner* — Christopher P Domone
(74) *Attorney, Agent, or Firm* — Jeffrey Coghlan

(57) ABSTRACT

An apparatus and method for initiating thermal runaway in a battery cell are provided. The apparatus and method may be used in safety research of battery cells and packs to initiate thermal runaway. The apparatus comprises a resistive heating element for positioning in thermal contact with the battery cell for transferring heat to a region of the battery cell. An energy source is electrically coupled to the resistive heating element. A switch selectively forms a circuit to send a current pulse through the resistive heating element to generate a power pulse at the resistive heating element to heat the region of the battery cell for initiating thermal runaway. Alternatively, the heating element is heated and
(Continued)

held at a predetermined temperature until thermal runaway is initiated. The heat generation rate may be designed to be comparable to that of an internal short circuit within a cell, which is much faster than many existing slow heating methods used to initiate thermal runaway.

25 Claims, 13 Drawing Sheets

(51) Int. Cl.
  *H01M 10/48* (2006.01)
  *G01R 31/28* (2006.01)
  *G01R 31/385* (2019.01)

(56) References Cited

U.S. PATENT DOCUMENTS

| | | | |
|---|---|---|---|
| 8,421,469 B2 | 4/2013 | Hermann et al. | |
| 8,729,904 B2 | 5/2014 | Yount | |
| 9,882,197 B2 | 1/2018 | Wang et al. | |
| 2014/0241394 A1* | 8/2014 | Olson | G01N 25/50 374/8 |
| 2015/0030901 A1* | 1/2015 | Bourgeois | H02J 7/007182 429/120 |
| 2015/0132612 A1 | 5/2015 | Bornet et al. | |

FOREIGN PATENT DOCUMENTS

| | | |
|---|---|---|
| CA | 2707552 A1 | 12/2011 |
| CN | 102117945 A | 7/2011 |
| CN | 103560302 A | 2/2014 |
| CN | 104330743 A | 2/2015 |
| CN | 204203436 U | 3/2015 |
| CN | 204362332 U | 5/2015 |
| CN | 104880676 A | 9/2015 |
| CN | 103837834 B | 5/2016 |
| CN | 105954678 A | 9/2016 |
| CN | 105974319 A | 9/2016 |
| JP | 2013149379 A | 8/2013 |
| WO | 2012105636 A1 | 8/2012 |

OTHER PUBLICATIONS

International Patent Application No. PCT/CA2018/050055, International Search Report and Written Opinion dated Apr. 13, 2018.
MacNeil et al., "Thermal Propagation within EV Battery Cells, Modules and Packs," National Research Council, Presentation 10th EVS-GTR Meeting, Mar. 2016, 31 pages.
Single Cell Thermal Runaway Initiation (SCTRI) Test—(Propagation), SAE International, NHTSA, pp. 168-289.
Watlow, ULTRAMIC Advanced Ceramic Heaters, Brochure, STL-ULT-0111, 2011, 8 Pages.
Canadian Patent Application No. 3,050,792, Office Action dated Jan. 14, 2020.
Golubkov et al., "Thermal-Runaway Experiments on Consumer Li-Ion Batteries With Metal-Oxide and Olivin-Type Cathodes," Royal Society of Chemistry Advances, Jan. 2014, vol. 4 (7), pp. 3633-3642.
Canadian Patent Application No. 3,050,792, Office Action dated Jun. 10, 2020.
Canadian Patent Application No. 3,050,792, Office Action dated Sep. 30, 2019.
Crafts et al., "Safety Testing of 18650-Style Li-Ion Cells," SANDIA Report SAND2000-1454C, Sandia National Laboratories, Jun. 2000, pp. 1-6, XP055123024. [retrieved on Jun. 12, 2014] Retrieved from the Internet:[URL:https://www.osti.gov/biblio/756429-safety-testing-style-li-ion-cells].
Doughty et al., "Electrical Energy Storage System Abuse Test Manual for Electric and Hybrid Electric Vehicle Applications," Sandia Report SAND2005-3123, Aug. 1, 2006, pp. 1-47, XP055122726. [retrieved on Jun. 11, 2014] Retrieved from the Internet:[URL:http://www.osti.gov/servlets/purl/889934-u8FwwR/].
European Patent Application No. 18741648.2, Extended European Search Report dated Oct. 21, 2019.
Ribiere et al., "Investigation on the Fire-Induced Hazards of Li-Ion Battery Cells by Fire Calorimetry," Energy & Environmental Science, Jan. 2012, vol. 5 (1), pp. 5271-5280, XP055122692.
Chinese Patent Application No. 201880007711.8, Office Action dated Oct. 9, 2021—English Translation available.
Japanese Patent Application No. 2019-539761, Office action dated Mar. 1, 2022—English Translation available.

* cited by examiner

APPARATUS AND METHOD FOR INITIATING THERMAL RUNAWAY IN A BATTERY

CROSS REFERENCE TO RELATED APPLICATIONS

This application claims the benefit of priority of U.S. Provisional Patent Applications No. 62/448,134 filed on Jan. 19, 2017, and No. 62/556,006 filed on Sep. 8, 2017, which are incorporated herein by reference.

FIELD

The present disclosure relates to battery technology, and more particularly to battery testing and safety.

BACKGROUND

Safety research of battery packs is intensifying with market adoption. This includes battery packs for electrified vehicles (EV). Many energy storage systems use hundreds of lithium ion battery cells. During abuse scenarios or due to defects, exothermic reactions cause temperatures to rise rapidly and uncontrollably, leading to energetic venting and/or fire. Above a critical temperature, the exothermic reactions outpace the heat being dissipated to the environment, and the temperature begins to rise rapidly and uncontrollably. Oxygen is liberated from the active materials and there is a release, sometimes violent, of toxic and flammable organic vapours. This process is known as thermal runaway. The critical temperature varies per battery and may depend on the size, shape, chemistry, etc. of the battery cell.

Conditions that may initiate cell failure include cell defects such as an internal short circuit within a cell. Another condition is vehicle system failure, for example overcharging of the battery. A further condition is the application of an external force such as a cell penetration or external heat. Due to the close proximity of neighbouring cells in some applications, if one cell goes into thermal runaway, a chain reaction of failures could result that would cascade through an entire array of battery cells.

Multiple cell runaway tends to be an extreme event, which may include energetic collisions, adjacent fire, and/or severe overcharge. A single cell runaway event tends to be more subtle, such as cell internal short circuit, manufacturing defects, cell aging, and should be expected to be mitigated through proper design of a battery pack.

There have been various methods to initiate thermal runaway investigated, for example for testing and/or research purposes. These include penetrating or puncturing the cell, for example with a nail, screw, blunt object, or other object, or crushing the cell. This technique has been a somewhat common method but has questionable reproducibility and minimal energy introduction. Unfortunately, it is difficult to implement for a single cell in a battery pack having multiple cells, is difficult to implement in a battery pack within a vehicle, and it may alter cell/module boundary conditions.

Another common thermal runaway initiation technique is cell heating. Cell heating may be performed by placing the battery or battery cell in an oven or on a hot plate. Heating may also be delivered by wrapping resistive heating wire around the whole or parts of the battery cell. Cell heating can provide good reproducibility, it may be applied externally to the cell (e.g. conductive, laser, other) or internally, it has a long activation time, and it can heat up adjacent cells significantly affecting boundary conditions.

Another thermal runaway initiation technique is cell overcharging, which can have good reproducibility, but is difficult to implement across different cell designs. Built-in circuit interrupt devices within the cell and other internal safety mechanisms may prevent thermal runaway initiation using this method. This technique also adds significant uncharacteristic energy to the cell which may intensify the resulting thermal runaway reaction.

Another thermal runaway initiation technique is cell defect introduction, which can involve the intentional introduction of a defect to cause an internal short circuit within the cell. This approach is less common, it may have unknown reproducibility, and it can require specially built cells making implementation impractical and a safety hazard.

Presently there is no standardized test method to evaluate the risk of cell failure or failure propagation to the surrounding cells in EV battery packs.

Regulatory bodies for transportation are actively trying to develop an accurate, reproducible, simple and robust way of initiating a thermal event within battery packs to determine the safety of battery pack designs as well as transportation (cargo) of large numbers of batteries.

Accordingly, improvements in and relating to systems and processes for initiating thermal runaway in one or more battery cells are desired.

The above information is presented as background information only to assist with an understanding of the present disclosure. No assertion or admission is made as to whether any of the above might be applicable as prior art with regard to the present disclosure.

BRIEF DESCRIPTION OF THE DRAWINGS

Embodiments of the present disclosure will now be described, by way of example only, with reference to the attached Figures.

DETAILED DESCRIPTION

Figure 1:
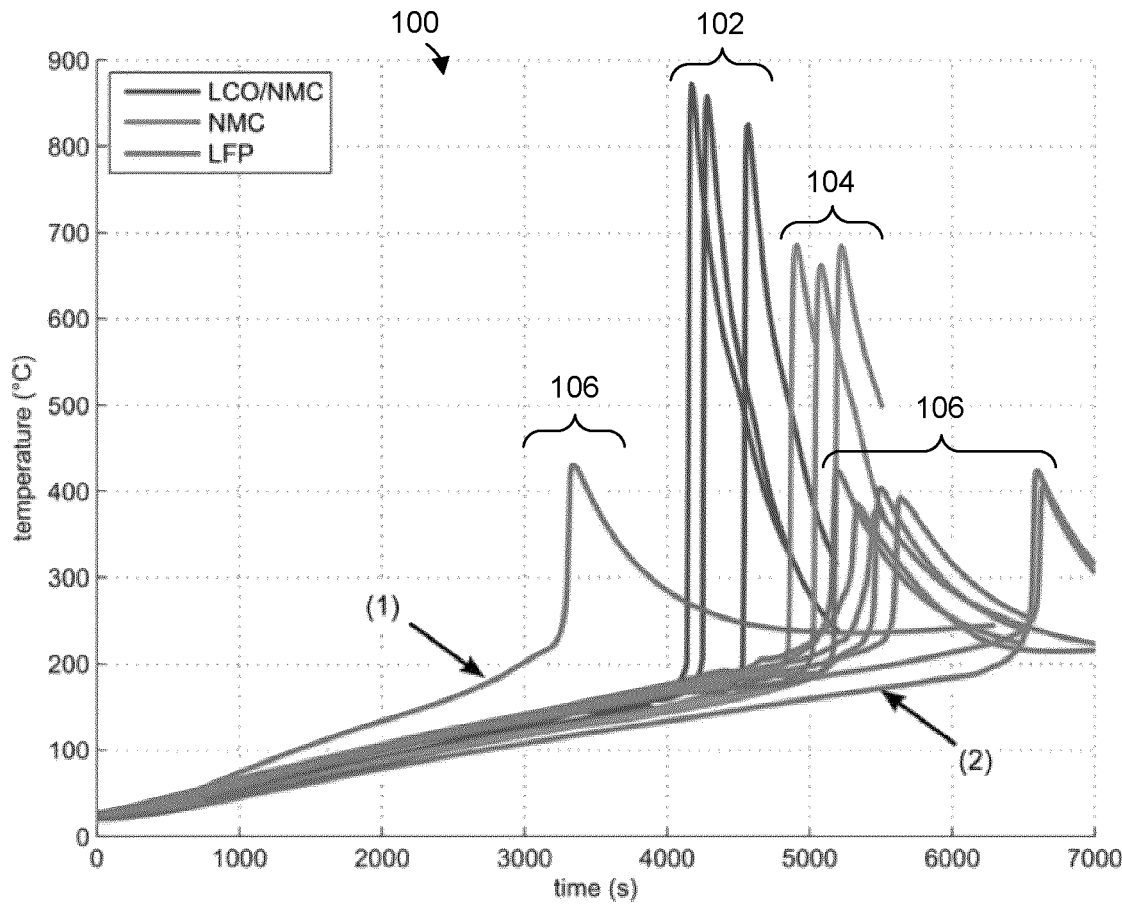
FIG. 1 is a temperature versus time graph for lithium ion 18650-sized cells exhibiting thermal runaways for various lithium ion chemistries.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

FIG. 1 is a temperature versus time graph 100 showing examples of thermal runaways in 18650 battery cells containing three different lithium ion chemistries, namely cathode active materials with blended $LiCoO_2$ and $Li(Ni_{0.50}Mn_{0.25}Co_{0.25})O_2$ (LCO/NMC), $Li(Ni_{0.45}Mn_{0.45}Co_{0.10})O_2$ (NMC), and $LiFePO_4$ (LFP), respectively. For these example plots, lithium ion 18650 cells were placed in an accelerating rate calorimeter and heated with a heat-rate of ~2° C. per minute starting at 25° C. After reaching a critical onset temperature (between 150° C. and 220° C.), the cell went into thermal runaway. Peaks of the various plots for each of the chemistries LCO/NMC 102, NCM 104, and LFP 106 are labeled on the graph. The graph of FIG. 1 appears in Golubkov, A. W., et al., *Thermal-runaway experiments on consumer Li-ion batteries with metal-oxide and olivin-type cathodes*, Royal Society of Chemistry Advances, 2014, 4, 3633-3642, which is incorporated herein by reference.

The x-axis in graph 100 of FIG. 1 represents time in seconds(s). The time from 0 until thermal runaway occurs, as indicated by the peaks 102, 104, 106, vary between around 3500 seconds to around 7000 seconds, which translates into approximately 1 to 2 hours.

One or more of the following characteristics for a device or process that initiates thermal runaway may be desirable: the initiation method mimics the heat generation profile of an internal short circuit in both peak power and rate of reaction; the process is adaptable to testing within a full battery pack using various types, sizes and geometries of cells; the process avoids affecting the battery pack layout and design, its construction or neighbouring cells as well as minimizing the addition of material not typically present in a rechargeable energy storage system (REESS) and the addition of additional energy to the system; and the process is reliable and as minimally invasive as possible.

The present disclosure is generally directed to the testing and evaluation of battery cells and battery packs consisting of a plurality of battery cells. A heating element may be used to simulate adverse conditions experienced by a battery cell. A rapid, localized heating source may be used to mimic a potentially dangerous circumstance that may arise during use of the battery by the consumer. Such circumstances include overheating due a short circuit due to a defect in the cell, overheating due to overcharging, or the receipt of an external force such as a physical blow or puncture, or external heat. Thermal runaway in one battery cell may cause a chain reaction of failures that cascade through the entire battery pack. The application of rapid, localized heat to a battery cell allows for the conditions leading up to, during, and/or following thermal runaway to be studied.

In one aspect, the present disclosure generally provides apparatuses, methods, and systems that may be used to locally heat a battery cell with a pulse of heat created by providing a high powered electrical pulse to a resistive heating element positioned in thermal contact with the cell. The pulse may be generated by the sudden and fast release of energy stored in an energy source, such as one or more capacitors. The heat generation rate may be designed to be equal to or around that observed from an external short circuit, but applied to a much smaller surface area, which is more characteristic of an internal short circuit. Applying the same power to a smaller area may increase the heat flux and may achieve much hotter local temperatures. Once the internal battery materials reach a critical temperature, thermal runaway proceeds.

In another aspect, the present disclosure generally provides apparatuses, methods, and systems that may be used to locally heat a battery cell with heat created by providing and controlling an electric current to a resistive heating element positioned in thermal contact with the cell. The approach utilizes closed-loop control and comprises at least two stages, the first being rapidly heating the resistive heating element to a predetermined temperature. The second stage comprises holding the resistive heating element more or less at the predetermined temperature until thermal runaway is initiated. The heat may be applied to a small surface area of the battery cell relative to the size of the cell thereby increasing the heat flux and leading to very hot local temperatures. Once the internal materials of the battery cell reach a critical temperature, thermal runaway initiates.

In an aspect, the present disclosure is directed to an apparatus for initiating thermal runaway in a battery cell, the apparatus comprising: a resistive heating element for positioning in thermal contact with the battery cell for transferring heat to a region of the battery cell; an energy source electrically coupled to the resistive heating element; and a switch for selectively forming a circuit to send a current pulse through the resistive heating element to generate a power pulse at the resistive heating element to heat the region of the battery cell for initiating thermal runaway.

In an embodiment, the current pulse has an exponential decay.

In an embodiment, a peak heat flux density at the resistive heating element generated by the power pulse is at least 1,000,000 watts per meter squared (W/m2) where the power in watts is heating power at the resistive heating element and the area in meters squared is a footprint surface area of the resistive heating element. In other embodiments, a peak heat flux density at the resistive heating element generated by the power pulse is at least 800,000 watts per meter squared (W/m2), 1,600,000 W/m2, or any other suitable value.

In an embodiment, the peak heat flux density at the resistive heating element is at least 6,000,000 W/m2. In an embodiment, the peak heat flux density at the resistive heating element is at least 2,000,000 W/m2.

In an embodiment, the footprint surface area of the resistive heating element is no more than 20% of the total external surface area of a casing of the battery cell.

In an embodiment, the footprint surface area of the resistive heating element is no more than 10% of the total external surface area of a casing of the battery cell.

In an embodiment, the footprint surface area of the resistive heating element is no more than 5% of the total external surface area of the casing of the battery cell.

In an embodiment, at least 95 percent of the energy stored in the energy source is applied in no more than 60 seconds following the switch forming the circuit.

In an embodiment, at least 95 percent of the energy stored in the energy source is applied in no more than 30 seconds following the switch forming the circuit.

In an embodiment, the energy source comprises at least one capacitor.

In an embodiment, the energy source comprises a continuous DC power supply.

In an embodiment, a ratio of a peak heating power in kilowatts (kW) at the resistive heating element during the discharge of the energy source to a standard 1C C-rate constant current discharge cycle power in kW of the battery cell is at least 50 to 1, wherein C-rate is a measure of the rate at which a battery is discharged relative to its maximum capacity.

In an embodiment, a ratio of the heat energy in kilojoules (kJ) dissipated by the resistive heating element during the discharge of the energy source to the energy storage capacity (kJ) of the battery cell is within the range of 0.02 to 0.04. In an embodiment, the ratio less than 0.10.

In an embodiment, the discharge of the energy source causes the surface of the battery cell to heat to at least 150 degrees Celsius.

In an embodiment, the apparatus further comprises an electrical isolation barrier external to the resistive heating element to electrically isolate the resistive heating element. In an embodiment, the electrical isolation barrier comprises a ceramic coating.

In an embodiment, the resistive heating element comprises a heat conducting metal based coating external to the ceramic coating.

In an embodiment, the resistive heating element comprises a conductive heat transfer paste external to the metal based coating.

In an embodiment, the resistive heating element has a planar-like shape.

In an embodiment, the resistive heating element is pliable allowing its shape to be modified to correspond to an external surface of the battery cell.

In an embodiment, the resistive heating element has a thickness of no more than 5 millimeters. In an embodiment, the resistive heating element has a thickness of no more than 2 millimeters.

In an embodiment, the resistive heating element comprises nichrome.

In an embodiment, the resistive heating element comprises an iron-chromium-aluminum (FeCrAl) alloy.

In an embodiment, the apparatus is configured to send a single current pulse through the resistive heating element.

In an aspect, the present disclosure is directed to a method for initiating thermal runaway in a battery cell, the method comprising: providing a resistive heating element in thermal contact with the battery cell for transferring heat to a region of the battery cell; providing an energy source electrically coupled to the resistive heating element; and selectively forming a circuit to send a current pulse through the resistive heating element to generate a power pulse at the resistive heating element to heat the region of the battery cell for initiating thermal runaway.

In an embodiment, the current pulse has an exponential decay.

In an embodiment, the power pulse generates a peak heat flux density at the resistive heating element of at least 1,000,000 watts per meter squared ($W/m^2$) where the power in watts is heating power at the resistive heating element and the area in meters squared is a footprint surface area of the resistive heating element. In an embodiment, a peak heat flux density at the resistive heating element generated by the power pulse is at least 800,000 watts per meter squared (W/m2).

In an embodiment, the peak heat flux density at the resistive heating element is at least 6,000,000 $W/m^2$. In an embodiment, the peak heat flux density at the resistive heating element is at least 2,000,000 W/m2.

In an embodiment, the provided resistive heating element has a footprint surface area of no more than 20% of the total external surface area of a casing of the battery cell.

In an embodiment, the provided resistive heating element has a footprint surface area of no more than 10% of the total external surface area of a casing of the battery cell.

In an embodiment, the footprint surface area is no more than 5% of the total external surface area of the casing of the battery cell.

In an embodiment, at least 95 percent of the energy stored in the energy source is applied in no more than 60 seconds following the switch forming the circuit.

In an embodiment, at least 95 percent of the energy stored in the energy source is applied in no more than 30 seconds following the switch forming the circuit through.

In an embodiment, the provided energy source comprises at least one capacitor.

In an embodiment, the energy source comprises a continuous DC power supply.

In an embodiment, a ratio of a peak heating power in kilowatts (kW) at the resistive heating element during the discharge of the energy source to a standard 1C C-rate constant current discharge cycle power in kW of the battery cell is at least 50 to 1, wherein C-rate is a measure of the rate at which a battery is discharged relative to its maximum capacity.

In an embodiment, a ratio of the heat energy in kilojoules (kJ) dissipated by the resistive heating element during the discharge of the energy source to the energy storage capacity (kJ) of the battery cell is within the range of 0.02 to 0.04. In an embodiment, the ratio is less than 0.10.

In an embodiment, the discharge of the energy source causes a surface of the battery cell to heat to at least 150 degrees Celsius.

In an embodiment, the method further comprises providing an electrical isolation barrier external to the resistive heating element to electrically isolate the resistive heating element. In an embodiment, the electrical isolation barrier comprises a ceramic coating.

In an embodiment, the resistive heating element comprises a heat conducting metal based coating external to the ceramic coating.

In an embodiment, the resistive heating element comprises a conductive heat transfer paste external to the metal based coating.

In an embodiment, the provided resistive heating element has a planar-like shape.

In an embodiment, the resistive heating element is pliable allowing its shape to be modified to correspond to an external surface of the battery cell.

In an embodiment, the provided resistive heating element has a thickness of no more than 5 millimeters. In an embodiment, the provided resistive heating element has a thickness of no more than 2 millimeters.

In an embodiment, the provided resistive heating element comprises nichrome.

In an embodiment, the resistive heating element comprises an iron-chromium-aluminum (FeCrAl) alloy.

In an embodiment, the selectively forming a circuit sends a single current pulse through the resistive heating element.

In an aspect, the present disclosure is directed to an apparatus for initiating thermal runaway in a battery cell, the apparatus comprising: means for converting electrical energy into heat positionable in thermal contact with the battery cell for transferring heat to a region of the battery cell; means for providing energy electrically coupled to the resistive heating element; switching means for selectively sending a current pulse to the means for converting electrical energy into heat to generate a power pulse at the means for converting electrical energy into heat to heat the region of the battery cell for initiating thermal runaway.

In an aspect, the present disclosure is directed to an apparatus for initiating thermal runaway in a battery cell, the apparatus comprising: a resistive heating element for positioning in thermal contact with the battery cell for transferring heat to a region of the battery cell; an energy source electrically coupled to the resistive heating element; a temperature sensor for sensing the temperature of the resistive heating element; a temperature controller communicatively coupled with the temperature sensor, the temperature controller configured to cause energy to be released from the energy source to send current through the resistive heating element to generate power at the resistive heating element to heat the region of the battery cell for initiating thermal runaway, the temperature controller further configured to cause the resistive heating element to be heated to a predetermined temperature and to be held at the predetermined temperature in response to the sensing of the temperature of the resistive heating element.

In an embodiment, a peak heat flux density at the resistive heating element generated by the generated power is at least 800,000 watts per meter squared (W/m$^2$) where the power in watts is heating power at the resistive heating element and the area in meters squared is a footprint surface area of the resistive heating element.

In an embodiment, the footprint surface area of the resistive heating element is no more than 20% of the total external surface area of a casing of the battery cell.

In an embodiment, the resistive heating element has a planar-like shape.

In an embodiment, the resistive heating element is heated to the predetermined temperature from ambient temperature in no more than 3 seconds.

In an embodiment, the resistive heating element is pliable allowing its shape to be modified to correspond to an external surface of the battery cell.

In an embodiment, the resistive heating element has a thickness of no more than 5 millimeters. In an embodiment, the resistive heating element has a thickness of no more than 2 millimeters.

In an embodiment, the temperature controller uses pulse-width-modulation (PWM) to control the power generated at the resistive heating element.

In an embodiment, the energy source comprises a direct current (DC) power supply.

In an embodiment, the temperature sensor comprises a thermocouple.

In an embodiment, the temperature controller prevents the temperature of the resistive heating element from exceeding the predetermined temperature by more than 5% in response to the energy released from the energy source.

In an aspect, the present disclosure is directed to a method for initiating thermal runaway in a battery cell, the method comprising: providing a resistive heating element in thermal contact with the battery cell for transferring heat to a region of the battery cell; providing an energy source electrically coupled to the resistive heating element; sensing the temperature of the resistive heating element; releasing from the energy source to generate power at the resistive heating element to heat the region of the battery cell for initiating thermal runaway; and controlling the temperature of the resistive heating element such that the resistive heating element is heated to a predetermined temperature and is held at the predetermined temperature in response to the sensing of the temperature of the resistive heating element.

In an embodiment, the generated power at the resistive heating element produces a peak heat flux density at the resistive heating element of at least 800,000 watts per meter squared (W/m2) where the power in watts is heating power at the resistive heating element and the area in meters squared is a footprint surface area of the resistive heating element.

In an embodiment, the footprint surface area of the resistive heating element is no more than 20% of the total external surface area of a casing of the battery cell.

In an embodiment, the resistive heating element has a planar-like shape.

In an embodiment, the heating the resistive heating element comprises heating the resistive heating element to the predetermined temperature from ambient temperature in no more than 3 seconds.

In an embodiment, the resistive heating element is pliable allowing its shape to be modified to correspond to an external surface of the battery cell.

In an embodiment, the resistive heating element has a thickness of no more than 5 millimeters. In an embodiment, the resistive heating element has a thickness of no more than 2 millimeters.

In an embodiment, the controlling uses pulse-width-modulation (PWM) to control the temperature of the resistive heating element.

In an embodiment, the energy source comprises a direct current (DC) power supply.

In an embodiment, the temperature sensor comprises a thermocouple.

In an embodiment, the controlling comprises preventing the temperature of the resistive heating element from exceeding the predetermined temperature by more than 5% in response to the energy released from the energy source.

Figure 2:
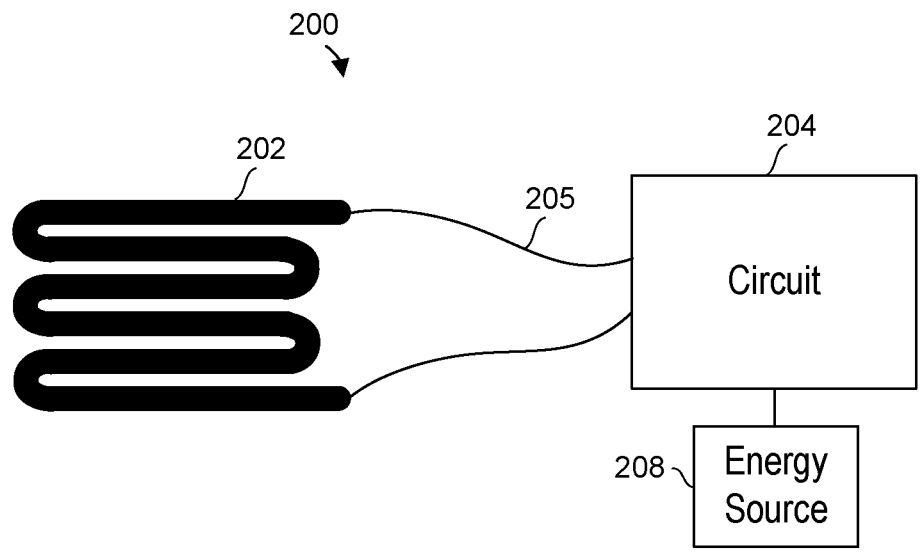
FIG. 2 is diagram of a heating element coupled to a circuit according an embodiment.

FIG. 2 is a diagram of an apparatus 200 comprising a heating element 202 coupled to a circuit 204 by one or more electrical conductors 205 according an embodiment of the present disclosure. It should be noted that the components shown in the Figures are not necessarily drawn to scale. Apparatus 200 is shown in isolation, meaning that no battery cells are shown. In some embodiments, the heating element 202 is a resistive heating element. The circuit 204 provides energy from an energy source 208. The apparatus 200 is generally configured to selectively form a circuit to send a current pulse through the resistive heating element 202 to generate a power pulse at the resistive heating element 202 to heat a region of a battery cell for initiating thermal runaway. In some embodiments the circuit 204 includes circuitry to control the transfer of energy from the energy source 208 to the heating element 202. In an embodiment, the energy source 208 is a pulsed power supply. In an embodiment, the energy source 208 comprises one or more capacitors. In an embodiment, the one or more capacitors may be super capacitors, such as but not limited to electrochemical double layer capacitors. In an embodiment, the one or more capacitors may be pulse-discharging capacitors, which are capable of releasing their electric energy in a very short time.

The current discharged by a charged capacitor is represented in equation (1) below:

$$I = \frac{V_0}{R} e^{-t/RC} \quad (1)$$

where I is the current, $V_0$ is the voltage across the charged capacitor, t is time, R is the resistance of the load, and C is the charge. RC is the time constant.

Figure 3:
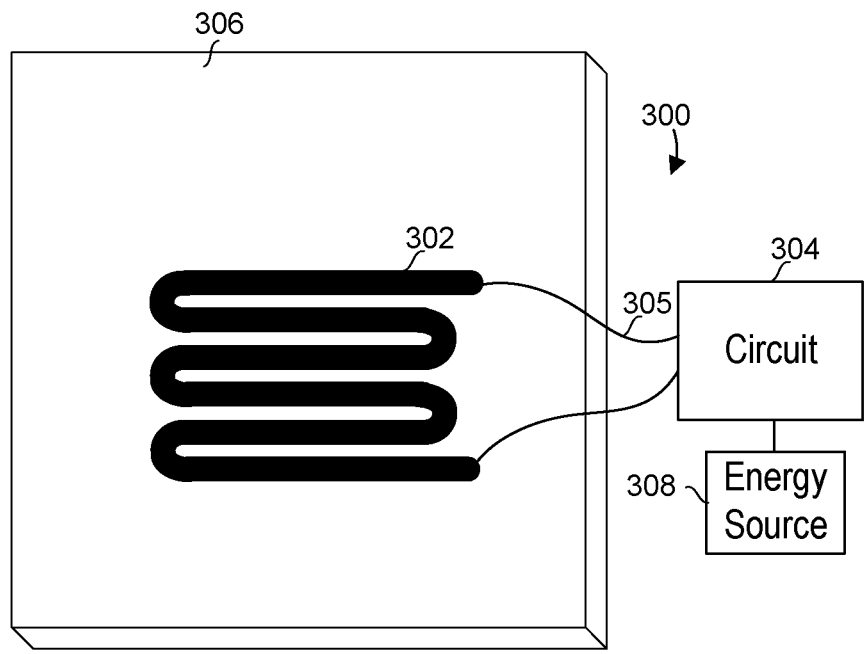
FIG. 3 is a diagram of an apparatus for initiating thermal runaway comprising a heating element in contact with a battery cell according an embodiment

FIG. 3 shows an example apparatus 300 for initiating thermal runaway. In this example configuration, heating element 302 is positioned in thermal contact with an example single battery cell 306. The term "thermal contact" is generally used herein to mean that two bodies can exchange energy through the process of conductive heat transfer. When energy is transferred from the energy source 308 to the heating element 302, the temperature of the heating element 302 increases and heat is transferred to the battery cell 306. In some embodiments, the heat transferred to the battery cell 306 causes a region of the battery cell 306 to reach a temperature that initiates a thermal runaway. The heating element 302 may be positioned in thermal contact with the battery cell 306 by affixing heating element 302 to an exterior surface of a casing of the battery cell 306.

In an embodiment, not shown, a resistive heating element may be integrated into the battery cell itself for testing purposes. In embodiment, the resistive heating element may be integrated into the casing of a battery cell.

Figure 4:
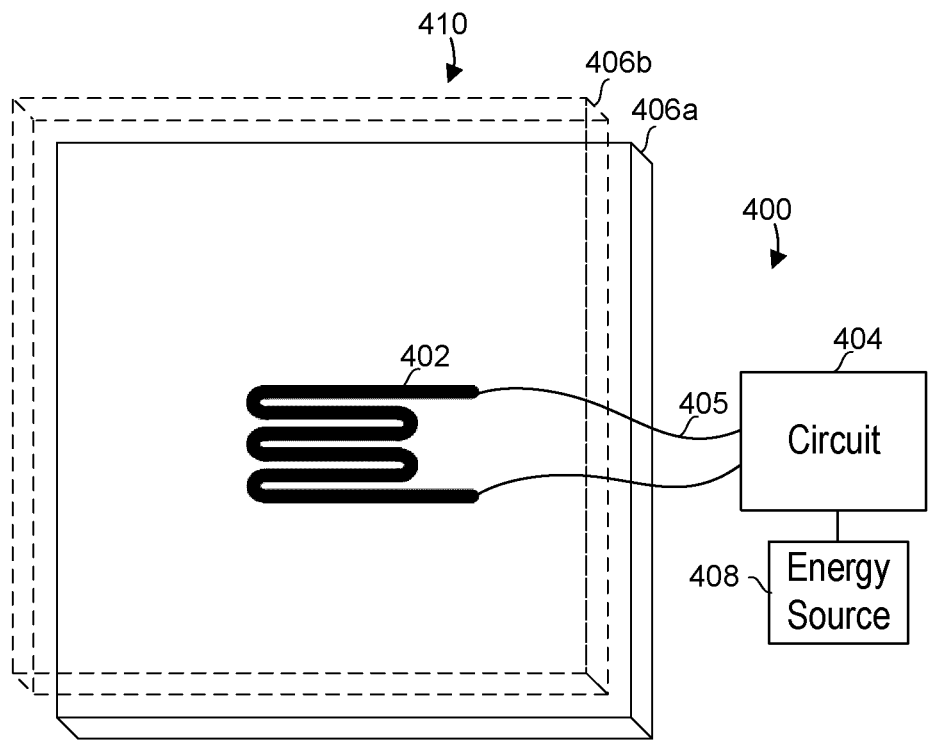
FIG. 4 is a diagram of an apparatus for initiating thermal runaway in a battery with more than one cell according to an embodiment of the present disclosure.

FIG. 4 shows an example apparatus for initiating thermal runaway 400 according to an embodiment of the present disclosure. This example configuration is similar to the one of FIG. 3 except that here there is a second battery cell. Specifically, a battery 410 comprises a first battery cell 406a and a second battery cell 406b. The second battery cell 406b, represented in broken lines and shown to be transparent for illustrative purposes, is illustrated as being in front of first battery cell 406a. Heating element 402 is positioned in thermal contact with first battery cell 406a while being disposed between the two battery cells 406a and 406b. Although battery 410 shown in FIG. 4 has only two battery cells, it is to be appreciated that the apparatuses and methods of the present disclosure may be used with batteries having more than two cells.

In an embodiment, heating element 402 may be in thermal contact with both the battery cells 406a and 406b. In some embodiments, an apparatus for initiating thermal runaway may comprise multiple heating elements that may be inserted between multiple battery cells.

Figure 5:
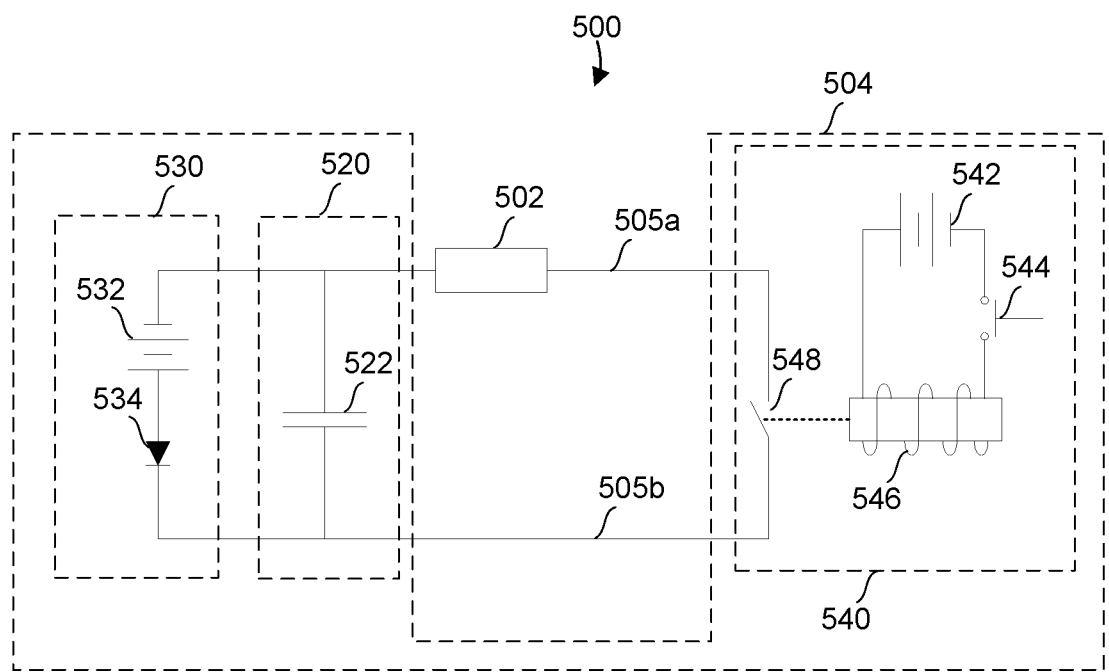
FIG. 5 is a schematic diagram of an apparatus for initiating thermal runaway according an embodiment of the present disclosure.

FIG. 5 is a schematic diagram of an example circuit 500 for initiating thermal runaway according an embodiment of the present disclosure. Circuit 500 comprises a resistive heating element 502, and a circuit 504 including an energy source 520. Although embodiments herein are described as having a resistive heating element, some embodiments may have one or more other types of heating elements (i.e. not necessarily resistive). In an embodiment, the energy source 520 comprises one or more capacitors 522 for storing energy in the form of an electric charge. In an embodiment, one or more of the capacitors may be ultra-capacitors. A charging system 530 may be provided to charge the energy source 520 prior to a test. In an embodiment, charging system 530 comprises an energy source 532, such as a direct current (DC) voltage source, and a blocking diode 534.

The circuit 504 may include control circuitry 540 for controlling the transfer of energy from the energy source 520 to the resistive heating element 502. As previously described, the circuit 500 is configured to selectively form a circuit to send a current pulse through the resistive heating element to generate a power pulse at the resistive heating element to heat the region of the battery cell for initiating thermal runaway. In an embodiment, the control circuitry 540 comprises an energy transfer switch 548 for selectively forming the circuit to cause the transfer of energy from the energy source 520 to the resistive heating element 502. The forming of the circuit may send an energy pulse, such as a current pulse, through the heating element to generate a power pulse at the heating element to heat the region of the battery cell.

In the embodiment of FIG. 5, the energy transfer switch 548 is shown as a mechanical switch actuated with a solenoid 546. Energy transfer switch 548 may be opened and/or closed by energizing solenoid 546 through the activation, or closing, of selecting switch 544 for forming a circuit for transferring energy from control circuitry energy supply 542 to the solenoid 546. The control circuitry energy supply 542 may be a battery or any other suitable source.

The energy transfer switch 548 may be activated manually or electronically by, for example, a computer, a processor, a microcontroller, digital circuitry, or other suitable electronic circuits. The energy transfer switch 548 may be any type of suitable switch, including but not limited to an electronically controlled mechanical switch, such as a relay, or a solid state switch implemented using semiconductor technology.

Although the embodiment of FIG. 5 comprises energy transfer switch 548, other embodiments may have any other suitable type of device other than a switch for selectively forming the circuit.

At least in some embodiments, the apparatus for initiating thermal runaway is configured such that resistive heating element 502 has a small surface area relative to the surface area or size of the battery cell so that the resistive heating element can generate a localized pulse or burst of heat energy to heat part of the battery cell to a temperature that will initiate thermal runaway. This is in contrast to applying heat energy over a larger area of the battery or the entire battery, which may either not heat the battery cell to a sufficient temperature for initiating thermal runaway, or which may eventually heat the cell to a sufficient temperature but only after a long period of time. As well, this may sufficiently heat surrounding battery cells to such a temperature that they are out of normal operating temperature range, or near the top, such that the boundary conditions of surrounding cells are sufficiently affected upon initiation of the thermal runaway event. In addition, the resistive heating element 502 may need to be at least of a certain size in order to be able to provide sufficient power to heat the region of the battery to a temperature at which thermal runaway is initiated.

The characteristics of the resistive heating element 502 may be chosen based on one or more factors, such as the amount of heat energy that is desired, the shape and/or size of the battery cell, and the components in the circuit 500 such as the energy source 520. Characteristics of the resistive heating element 502 may include the size, shape, thickness, material, and footprint surface area (FSA) of the heating element.

Figure 6:
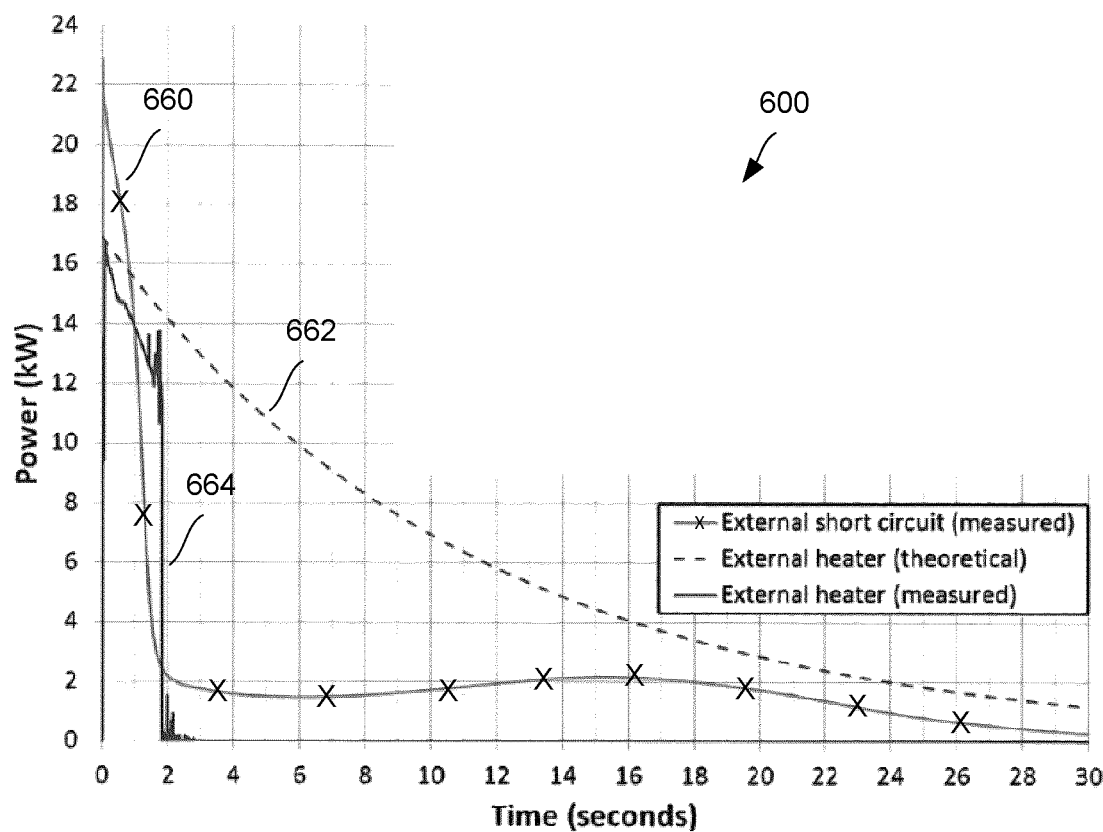
FIG. 6 is a graph showing power against time results for an embodiment of the present disclosure.

A number of experiments and tests were conducted using embodiments of the thermal runaway initiation apparatus according to the present disclosure. FIG. 6 is a graph 600 of power versus time showing power 664 produced at a resistive heating element by a thermal runaway initiation apparatus according to the present disclosure. Graph 600 also shows theoretical results 662 for the resistive heating element. The power is produced at the heating element as a result of the current pulse generated by the apparatus, in this embodiment due to the discharge of the capacitor. The power curves 662 and 664 are thus defined by the current pulse sent through the heating element.

Graph 600 further shows results 660 of a "hard" external short circuit of a lithium ion cell of the same type. The external short circuit was initiated by closing a low resistance circuit between the positive and negative terminals of the cell. The resistance of this circuit, not including the lithium ion cell, was 0.2 mOhm. The energy released by this "hard" external short circuit may be considered similar to one type of internal short circuit. The peak power (i.e. peak of a plot) and energy release shape and duration (i.e. decreasing plot following the peak) show a reasonable match between the thermal runaway initiation apparatus results 664 compared to external short circuit results 660. The peak of plot 664 is the peak of the power pulse at the resistive heating element. The shape of the energy release can be further controlled and tuned for different battery sizes and geometries through the use of additional circuitry, such as by adding rheostats to the circuit, or changing a pulse width, using more than one pulse and changing the height of a pulse. In some embodiments the additional circuitry is added in series to the heating element, although alternative embodiments may use combinations of additional circuitry in series and/or parallel.

Figure 7:
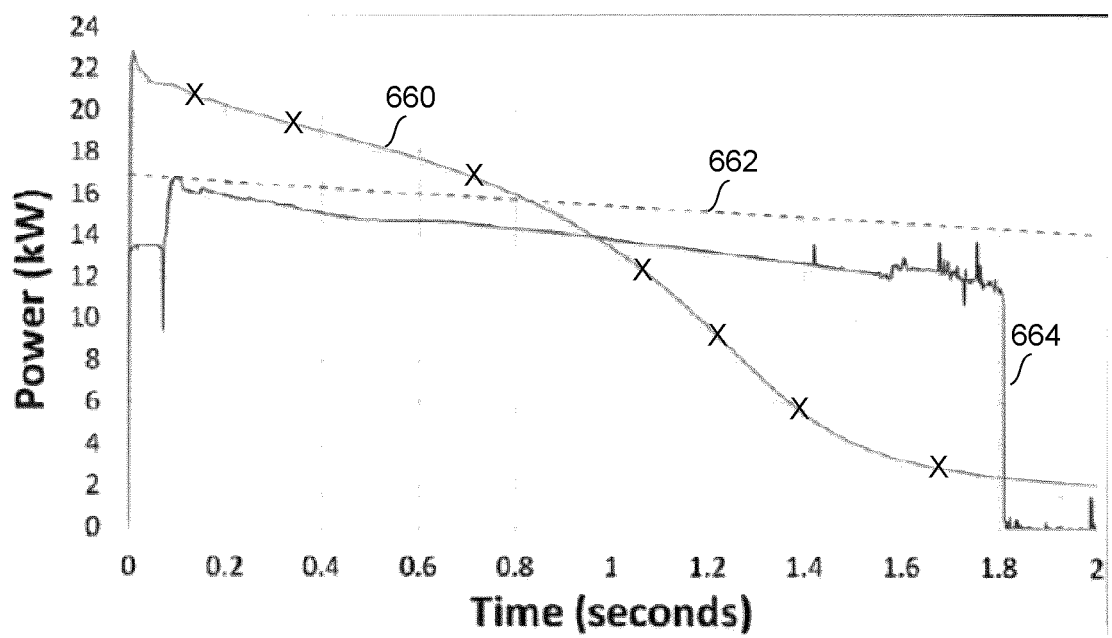
FIG. 7 is a is a close-up view of the graph of FIG. 6 in the time range of 0 to 2 seconds.

FIG. 7 is a close-up view of the graph of FIG. 6 in the time range of 0 to 2 seconds. Note that in contrast, FIG. 6 shows a time range between 0 and 30 seconds. In FIG. 7, the power produced at the heating element 664 initially rises rapidly between 0 and approximately 0.1 seconds to approximately 17 kW. The power then gradually declines until approximately 1.8 seconds where the power drops off significantly. This rapid increase and then decrease of the power at the heating element is an example of a power pulse that may be generated at a heating element according to the present disclosure.

Figure 8:
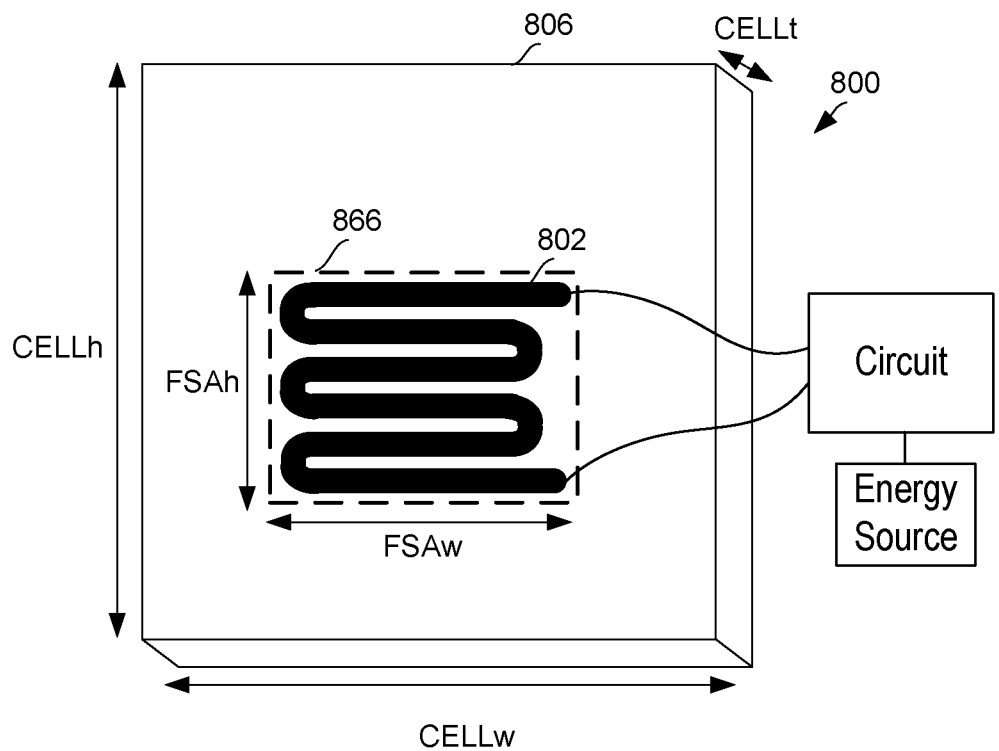
FIG. 8 is a diagram of an apparatus for initiating thermal runaway indicating a footprint surface area of a heating element according an embodiment of the present disclosure.

FIG. 8 is a diagram of an example apparatus 800 for initiating thermal runaway indicating a footprint surface area of a heating element 802. The footprint surface area (FSA) generally refers to an area bound by an outer perimeter drawn around the heating element. The FSA is indicated in this embodiment with broken line 866. The FSA in the embodiment of FIG. 8 is calculated as FSA=FSAw×FSAh. The FSA is smaller than the total external surface area of cell 806, which is calculated as the sum of the areas of all of the sides. In this embodiment, the FSA may be computed as follows 2(CELLw×CELLh)+2(CELLw×CELLt)+2(CELLh×CELLt).

In an embodiment, the FSA of the heating element 802 may be chosen to be a certain size (e.g. proportion) relative to the total surface area of the battery cell 806. Furthermore, although the FSA in the embodiment of FIG. 8 has a rectangular shape, this is not meant to be limiting. In other embodiments, a heating element may have any other suitable shape or layout, including but not limited to square, circular, or oval like shapes. In an embodiment, the resistive heating element is a continuous metallic element in the form of a planar like sheet having a complex resistive heating element pattern. The term resistive heating element pattern refers generally to the shape, size and layout of the conductive "track" of one or more resistive heating elements itself in at least one embodiment. The term complex generally refers to the resistive element having a layout where a segment of the heating element is close to one or more other segments of the heating element in order to physically concentrate heat emitted by the resistive heating element. Examples of heating element patterns are shown and described in the present disclosure, including in FIGS. 2, 9, 10, and 11, in which the heating element loops back and forth. It is to be appreciated that any other suitable patterns are contemplated and possible, and thus the present disclosure is not limited to the embodiments shown. Other patterns include but are not limited to spiral shaped patterns, criss-crossing patterns, and overlapping patterns.

Figure 9:
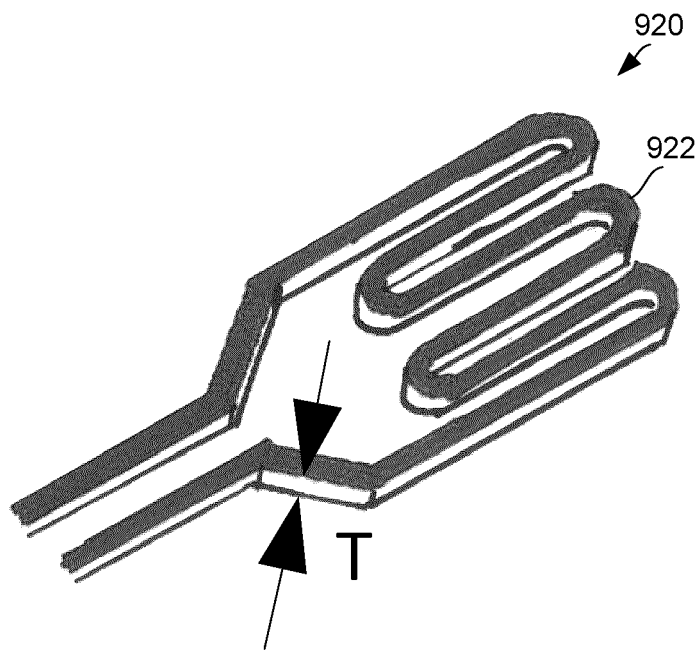
FIG. 9 is a perspective view of a heating element according an embodiment of the present disclosure.

FIG. 9 is a perspective view of a heating element 920 according to an embodiment of the present disclosure. As shown, the heating element may be planar in shape, meaning having a generally flat shape but having a thickness, T. A generally planar like shape can allow the heating element 920 to be inserted into tight spaces such as between adjacent battery cells in a battery pack. The heating element may have meandering sub-elements 922. The thickness T may be of any suitable value. In various embodiments, the thickness T may be, for example, approximately 1 millimeter, 2 millimeters, 3 millimeters, 4 millimeters, 5 millimeters, any value there between, below 1 millimeter, or above 5 millimeters. In an embodiment, the heating element 920 has a thickness T of no more than 5 millimeters. The thickness T of the heating element may be partly based on the desired resistance of the heating element, where resistance may be calculated by multiplying the cross sectional area of a strand of the element by the length of the element. Thus increasing the thickness may proportionally decrease the resistance.

In other embodiments, the heating element may be molded or otherwise shaped to the surface of a battery cell. In some embodiments, the heating element may be made of bendable or pliable material allowing its shape to be modified to correspond to an external surface of a battery cell. These options may be suitable when the surface of the battery cell is not flat, for instance when a cylindrical battery is used.

The heating element 920 may be made of any suitable material or materials. In an embodiment, the resistive heating element is comprises or consists essentially of metal or metal alloy. In an embodiment, the resistive heating element is made wholly or partly of nichrome, which is an alloy of nickel and chromium. The composition of the nichrome may be approximately 80% nickel and 20% chromium, or any other suitable ratio. In an embodiment, the metal may comprise Tungsten. In an embodiment, the resistive heating element may comprise an iron-chromium-aluminum (FeCrAl) alloy.

Figure 10:
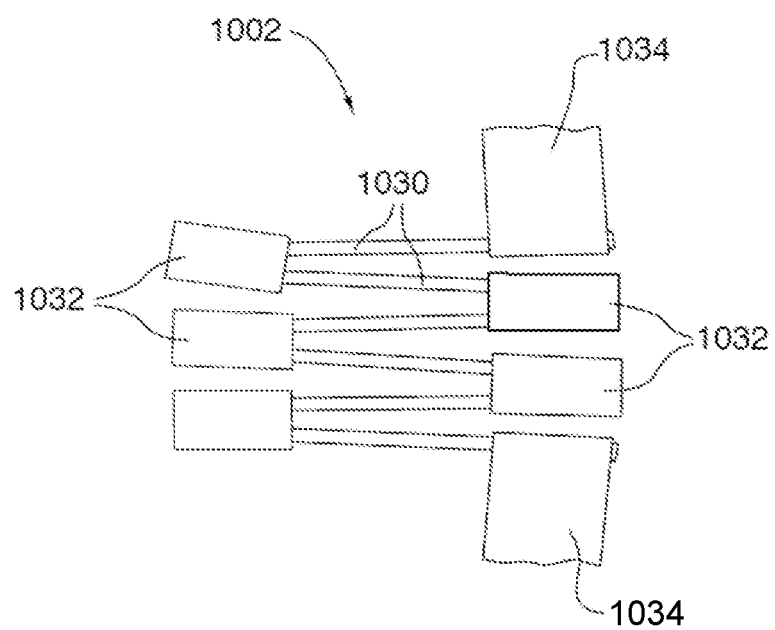
FIGS. 10 and 11 show two different example resistive heating elements.
Figure 11:
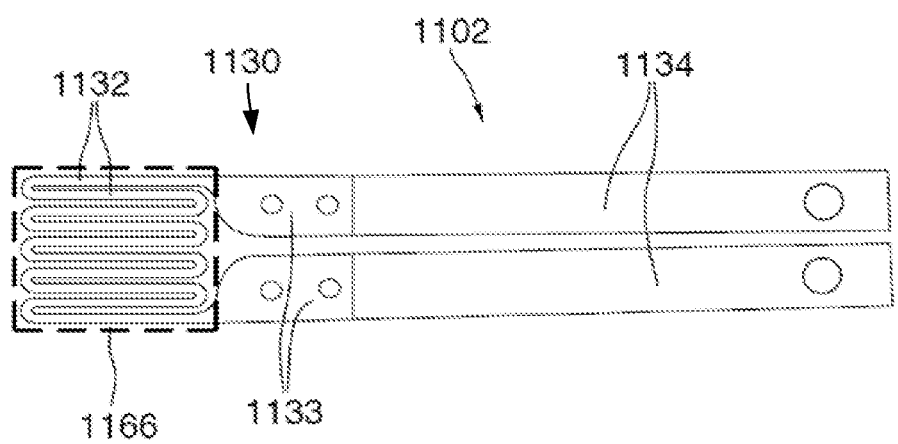

FIGS. 10 and 11 show two different example resistive heating elements. The element 1002 in FIG. 10 was handmade and comprises several separate resistive elements 1030 made of chromel A (nichrome) joined by copper joints 1032 and connected between two copper strips 1034. The element 1102 in FIG. 11 was precision machined and comprises a metal resistive heating element portion 1130 made of nichrome connected between two copper strips 1134. Metal resistive heating element portion 1130 comprises a plurality of meandering sub-elements 1132 and a pair of connection tabs 1133 for connection with a pair of conductors such as strips 1134. The FSA of heating element 1102 is indicated in this embodiment with broken line 1166. The FSA 1166 indicated in FIG. 11 does not include the connection tabs 1133 since the temperature of tabs 1133 during heating is typically far lower than the temperature of the meandering sub-elements 1132. However, the connection tabs in other embodiments may be considered as forming part of the FSA.

In an embodiment, the FSA of the heating element 402 is no more than 20% of the total external surface area of a casing of the battery cell. In an embodiment, the FSA of the heating element 402 is no more than 10% of the total external surface area. In an embodiment, the FSA of the heating element 402 is no more than 5% of the total external surface area. In an embodiment, the FSA of the heating element 402 is within the range of 5% to 10% of the total external surface area. In other embodiments, the FSA may have a different percentage of the total external surface area.

Figure 12:
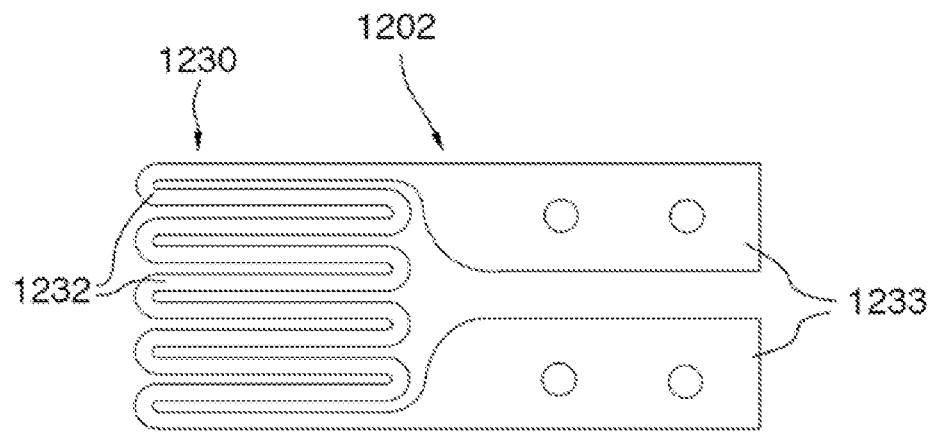
FIG. 12 is a photograph of an example resistive heating element.

FIG. 12 is a photograph of another example resistive heating element 1202, which was precision machined. Element 1202 is made of nichrome and comprises a plurality of meandering sub-elements 1232 and a pair of connection tabs 1233 for connection with a pair of conductors such as copper wires or strips.

In an embodiment, an electrical isolation barrier is provided externally to the resistive heating element to electrically isolate the resistive heating element from any other surfaces with which the resistive heating element would have otherwise come into contact. An example of electrically isolating the resistive heating element is to place an electrical insulator between the heating element and a battery cell. In some embodiments, the heating element comprises an external ceramic coating. In another embodiment, the electrical isolation barrier may be a paste such as a ceramic based paste.

Furthermore, in an embodiment, the resistive heating element comprises a heat conducting coating, such as a copper coating, which may be external to the ceramic coating. A ceramic coating may electrically isolate the conductive heating element material but the heat conducting coating provides a thermally conductive surface to facilitate or improve the transfer and/or distribution of heat from the heating element material to the casing of the battery cell.

Furthermore, in an embodiment, the resistive heating element comprises a heat conducting material such as a paste, which may be external to the heat conducting coating. The paste may improve the physical contact and thus improve the thermal energy transfer between the resistive heating element and the casing of the battery cell. It has been discovered that, in at least some embodiments, a nickel based paste greatly improves the heat transfer rate between the heating element and the battery cell. The heat conducting paste may be any suitable type of paste, including but not limited to nickel based paste. In some embodiments, the heat transfer rate-limiting component in the process is the heat transfer rate of the external casing of the battery cell.

Figure 13:
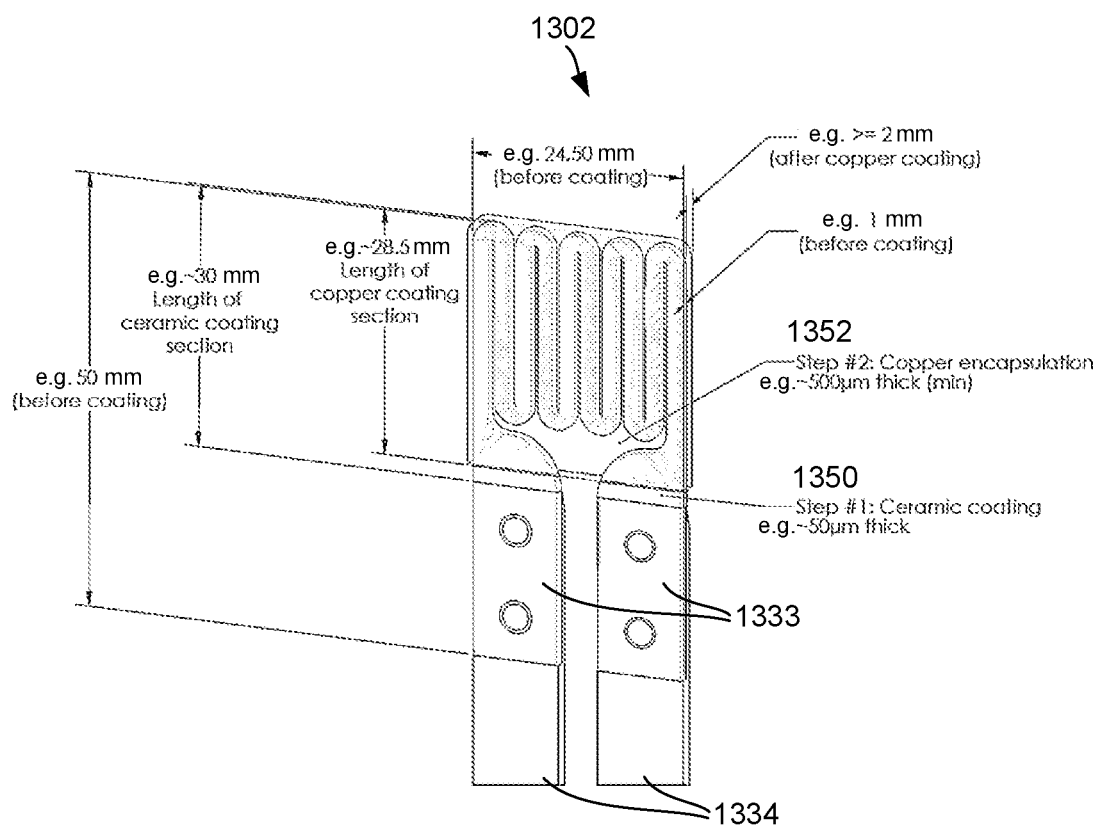
FIG. 13 is a representation of an example resistive heating element that comprises several optional coatings.

FIG. 13 is a representation of an example resistive heating element 1302 that comprises several optional coatings. Resistive heating element 1302, which may be made of nichrome or any other suitable material, is provided with an electric isolation barrier coating 1350, such as ceramic. Heating element 1302 may then be provided with a heat conducting coating 1352, such as copper. In general, there should be no electrical contact between heat conducting coating 1352 and the nichrome or other material of the resistive heating element 1302A. Further, connection tabs 1233 of heating element 1302 may be connected to a pair of conductors such as copper wires or strips 1334.

In addition, various physical dimension values are shown in FIG. 13, which are only examples. In this embodiment, the resistive heating element 1302 has a length of 50 mm, a width of a 24.5 mm, and a thickness of 1 mm prior to any coatings. The portion of heating element 1302 that is coated with an electric isolation barrier 1350 is approximately 30 mm, and the electric isolation barrier 1350 is approximately 50 μm thick. The portion of heating element 1302 that is then coated with an heat conducting coating 1352 is approximately 28.5 mm, and the heat conducting coating 1352 is approximately 500 μm thick. However, a thicker heat conducting coating 1352, such as copper, may allow for smoother surface to be machined at the exterior surface of coating 1352 to potentially improve the thermal contact with a battery cell casing. Further, the heating element 1302 has a thickness of at least 2 mm after the heat conducting coating 1352 is provided. Again, the physical dimensions of this embodiment are only examples and thus are not meant to be limiting.

In other embodiments, the footprint surface area (FSA) of the resistive heating element may be in the range of 5.0 to 6.0 cm$^2$, including 5.4 cm$^2$ (embodiment of FIG. 13), 5.6 cm$^2$ (embodiment of FIG. 18) or any other suitable value.

Figure 14:
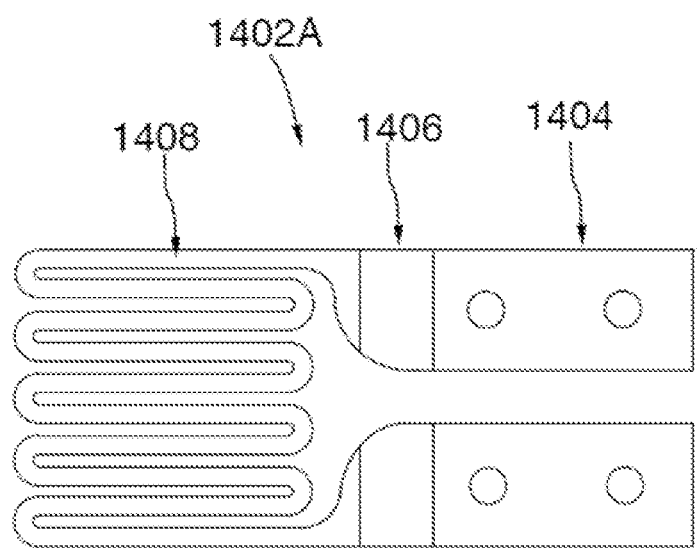
FIG. 14 is a photograph of the resistive heating element FIG. 12 comprising several optional coatings.

FIG. 14 is a photograph of the resistive heating element 1402 of FIG. 12 that has been coated with a ceramic electrical insulator material 1406 and then with a copper heat conducting material 1408. There is a physical gap, indicated by 1406, between the copper conductive material 1408 and the bare nichrome 1404 portion of the heating element 1402 to electrically isolate the copper from the nichrome.

As previously described, in use, the resistive heating element may be positioned in thermal contact with a battery cell for transferring heat to a region of the battery cell. In an embodiment, the energy source is electrically coupled to the heating element and energy is transferred to the heating element by a switch, which selectively forms a circuit to send a current pulse through the heating element to generate a power pulse at the heating element. The energy transferred to the heating element causes heat to be generated, which heats a region of the battery cell that is proximate to the heating element, and in certain circumstances thermal runaway is initiated, for example when the heat exceeds a critical temperature. The critical temperature will vary case by case and will usually depend on one or more of the characteristics of the battery cell such as its type, size, shape, materials from which it is made, etc. The internal battery temperature typically needs to be within the range of 150 to 220 degrees Celsius to initiate the exothermic reactions that lead to thermal runaway, but it may be outside of this range.

Further, the temperature required at the exterior surface of the battery casing to cause the region of the battery cell to reach the critical temperature will also generally depend on characteristics of the battery, such as the thickness of the casing, the material from which the casing is made, etc. For instance, a higher temperature at the exterior surface may be required when the casing is thicker. In some embodiments, a single current pulse is sent through the heating element. The single pulse may be generated by the sudden and fast release of the energy stored in the energy source, such a one or more capacitors.

To initiate thermal runaway, the heating element itself generally needs to be heated above the critical temperature. The heating element may be heated to a predefined temperature. In some embodiments, the heating element is heated to a temperature that is around or just below the highest temperature the element can withstand without failing (e.g. burning out, etc.). This generally provides for the fastest heating of the battery cell as is possible with the particular heating element. However, in other embodiments, the heating element may be heated to a lower temperature than the element can withstand, for example to prevent or slow the melting of the battery casing or for any other suitable reason. The heating element is heated to a temperature in the range of 200 to 1400 degrees Celsius or to any other suitable value. In some embodiments, the heating element is heated to a temperature of around 900, 1000, 1100, 1200, 1300, 1400, or 1500 degrees Celsius, or to any value below, above, or in between these values. The temperature typically depends on one or more factors, such as the type of heating element, the type of battery cell under test, the characteristics of the battery casing, etc.

Characteristics of the resistive heating element may be chosen based on one or more factors, such as the amount of heat energy that is desired, the shape and/or size of the battery cell, and the components in the overall apparatus such as the energy source. Characteristics of the resistive heating element may include the size, shape, thickness, material, and footprint surface area (FSA) of the heating element. Again, the footprint surface area generally refers to the area defined by a perimeter line drawn around the heating element.

In an embodiment, an important design characteristic is the peak heat flux density at the resistive heating element generated by a power pulse at the resistive heating element as a result of the discharging of energy from the energy source. Heat flux density is measured in units of watts per meter squared ($W/m^2$). The power in watts is heating power at the resistive heating element and the area in meters squared is a footprint surface area of the resistive heating element. In an embodiment, the peak heat flux density at the heating element generated by the power pulse is at least 1,000,000 Watts per square meter ($W/m^2$). In an embodiment, a peak heat flux density at the resistive heating element generated by the power pulse is at least 800,000 watts per meter squared ($W/m^2$). In an embodiment, the peak heat flux density is at least 6,000,000 $W/m^2$. In other embodiments, the peak heat flux density is at least 2,000,000 $W/m^2$, at least 1,000,000 $W/m^2$, or any other suitable value.

In an embodiment, the characteristics of the resistive heating element may be chosen or matched to capacitor characteristics. In some embodiments resistive heating element characteristics are matched to circuit characteristics to provide, for example, desired energy pulse characteristics. In some embodiments, the design of the resistive heating element and/or the circuit may be based on characteristics of the battery cell. Example battery cells may be part of thin batteries having low thermal mass, or big brick-shaped batteries having a large thermal mass.

In order to generate an intense pulse of energy at the resistive heating element, in some embodiments, the energy source, such as one or more capacitors, is capable of discharging energy quickly. For at least some embodiments, it is desirable that the energy source be capable of providing peak power that has a similar profile or shape that observed in an external short circuit, which is characterized as a first order decay and taking approximately 30 seconds to a 95% energy depletion. Accordingly, in at least some embodiments, the energy source provides power according to an exponential decay function.

In an embodiment, the energy source is capable of discharging at least 95% of its electrical energy, or charge, in no more than 60 seconds once the energy transfer switch is closed. In an embodiment, the energy source is capable of discharging at least 95% of its electrical energy in no more than 30 seconds once the energy transfer switch is closed. In other embodiments the time to 95% energy depletion, or discharge, may be in the range 2 seconds to 60 seconds, no more than 120 seconds, or any other suitable time or range of times. It is to be appreciated that these values of energy depletion and values of elapsed times are provided only as examples and are not meant to be limiting. As previously described, the energy source may comprise one or more capacitors, and some embodiments may comprise one or more super capacitors. For at least some embodiments, an ultracapacitor was determined to be a good choice since its energy release is much higher and quicker than a conventional constant DC power source can provide.

A discharge rate of a battery or energy source can be quantified in terms of a "C-rate". The C-rate is a measure of the rate at which a battery or other energy source is discharged relative to its maximum capacity. In an embodiment, a ratio of a peak heating power in kilowatts (kW) at the resistive heating element during the discharge of the energy source to a standard 1C C-rate constant current discharge cycle power in kW of the battery cell is at least 50 to 1. In an embodiment, the ratio is at least 100 to 1. However, in other embodiments the ratio may be lower or higher. In an experiment conducted, the battery cells tested had a standard 1C discharge power of $4.2V \times 45 A = 189 W$.

The peak heating power generated by the energy pulse at the resistive heating element may vary per embodiment and may depend on how much heat is required to heat a region of a battery cell to a sufficient temperature to start thermal runaway. In an embodiment, a peak heating pulse results in a peak heating power of approximately 17 kW. In other embodiments, the peak heating power may be in the range 10 kW to 23 kW. However, these values are only examples. In some embodiments, the heating power is reduced to a level that provides unbiased results while providing reliable thermal runaway.

In some embodiments, it is desirable to introduce the minimal amount of additional energy to initiate a thermal runaway. A measure of the additional applied energy may be the ratio of heat energy dissipated by the heating element to the energy storage capacity of the battery cell. In an embodiment, the ratio is less than 1. In an embodiment, the ratio of the heat energy in kilojoules (kJ) dissipated by the resistive heating element during the discharge of the energy source to the energy storage capacity (kJ) of the battery cell is within the range of 0.02 to 0.04. In an embodiment, the ratio is less than 0.10. In an embodiment, the ratio is approximately 0.03, plus or minus 0.005. In other embodiments, the ratio may be outside of these ranges and values.

In contrast to the techniques according to the present disclosure, in some existing slow heating methods, meaning where the battery cell is heated slowly over a much longer period of time, the ratio is much higher. For example, some existing methods have a ratio of approximately 800 to 1, meaning 800 times more energy in the form of heat is applied than there is electrical energy stored in the battery cell being heated. Much of this additional heat gets absorbed by surround cells and severely biases failure propagation results.

Turning back now to the apparatus according to the present disclosure, the total energy dissipated by the resistive heating element will vary from embodiment to embodiment depending on the battery cell(s) and test scenario. In an embodiment, the total energy dissipated by the resistive heating element is within the range of approximately 15 to 25 kJ, although wider ranges are possible. In an example embodiment, the total energy dissipated is approximately 22 kJ applied to a cell with a measured energy storage capacity of 680 kJ. The ratio is therefore 22 kJ/680 kJ=0.032. In some embodiments, as little energy as necessary to ensure reliable initiation of thermal runaway is applied. In some embodiments, the maximum applied energy is limited by the energy source.

For at least some embodiments, it is desirable that the heating element is able to deliver the peak power before failing. In some embodiments, the sheer amount of energy transferred into the resistive heating element causes damage to the heating element. The power pulse may be of sufficient power to damage the heating element such that the heating element is unable to generate a further power pulse that is similar to the previous power pulse. In an embodiment, the heating element is unable to generate any further useful power pulses.

At least some embodiments according to the present disclosure are able to initiate thermal runaway in a target cell without pre-heating surrounding cells. Preheated cells are known to bias propagation results since they are closer to the thermal runaway critical temperature. Where one or more other battery cells are proximate to or in contact with the target batter cell, there may be some heat that gets transferred to one or more of these other cells. However, in some embodiments, it is a goal to keep the amount of heat that gets transferred to the other cells low. This is in contrast to heating the entire battery comprising multiple cells, or heating a larger area of the battery such that cells other than the target cell get heated.

The embodiments described herein may be applied to, but not limited to, batteries for powering electric vehicles, cell phones, planes, helicopters, or military hardware and the large scale storage of bulk energy from renewable or non-renewable sources. The embodiments described herein may be used in relation to, but not limited to, the transportation of dangerous goods or the transportation of batteries.

An embodiment according to the present disclosure was constructed and tested several times. This embodiment comprised a resistive heating element having a resistance of approximately 120 milli-ohms and dimensions of approximately 5 cm×5 cm, giving it a footprint surface area (FSA) of approximately 25 cm². The battery cell under test had dimensions of approximately 15 cm×19 cm with a thickness of 0.5 cm, which was considered as being negligible. Therefore the total external surface area of the cell was approximately 570 cm² (285 cm²×2 sides). Thus the FSA of the resistive heating element to the total external surface area of the cell was approximately 4.4%. The battery cell tested had a standard 1C discharge power of 4.2V×45 A=189 W. The peak heating power at the heating element was approximately 17 kW, and the ratio of the peak heating power to the 1C discharge power of the cell was therefore approximately 90 (17 kW/0.189 kW). The time to 95% energy depletion of the energy source was approximately 30 seconds. The total energy applied to the heating element was approximately 22 kJ, and the ratio of the applied energy to the rated electrical energy of the battery cell was approximately 3.2%.

This test embodiment was tested 12 times on various cell geometries, including pouch and prismatic cells, at ambient operating temperatures (0° C. to 25° C.). Thermal runaway was successfully initiated in the target cell 10 times. It is suspected that first failure was due to a poor installation of the heating element resulting in poor thermal contact between the heating element and the cell. It is suspected that the second failure was due to the low ambient temperature (0° C.) and thick cell case insulation in a prismatic battery cell.

Figure 15:
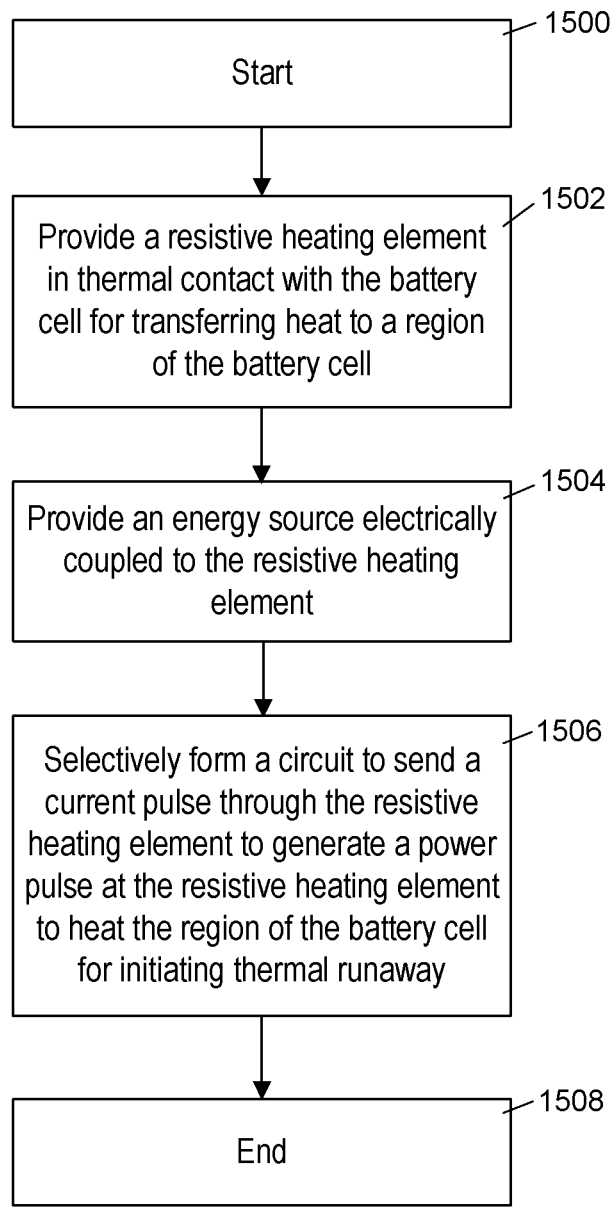
FIG. 15 is a process diagram for initiating thermal runaway in a battery cell in an embodiment according to the present disclosure.

FIG. 15 shows a process for initiating thermal runaway in a battery cell in an embodiment according to the present disclosure.

The process starts at block 1500 and proceeds to block 1502 where a resistive heating element is provided in thermal contact with the battery cell for transferring heat to a region of the battery cell.

The process proceeds to block 1504 where an energy source is provided that is electrically coupled to the resistive heating element.

The process proceeds to block 1506 where a circuit is selectively formed to send a current pulse through the resistive heating element to generate a power pulse at the resistive heating element to heat the region of the battery cell for initiating thermal runaway.

The process proceeds to block 1508 and ends.

According to another aspect of the present disclosure, a battery cell is heated locally with heat created by providing and controlling an electric current to a resistive heating element positioned in thermal contact with the cell for the purpose of initiating thermal runaway. The approach utilizes closed-loop control and comprises at least two stages, the first being rapidly heating the resistive heating element to a predetermined temperature. The second stage comprises holding the resistive heating element more or less at the predetermined temperature until thermal runaway is initiated. The two stages may generally be referred to as "ramp" and "set". Thus in some embodiments, a ramp and set approach is used instead of a single current pulse.

It has been determined that an efficient and effective process for inducing thermal runaway in a cell comprise at least two stages. The first stage involves applying high power to quickly heat up the heating element to a temperature that is higher than the critical temperature for inducing thermal runaway in the battery cell. The second stage involves applying small amounts of power to maintain the heating element temperature until thermal runaway begins.

In an embodiment, the first stage may have a very short time duration, for example in the range of approximately 1-3 seconds. Providing a short first stage is generally desired in at least some embodiments for simulating the heat generation profile of a true internal short circuit fault. A short first stage may also limit the amount of heat that gets transferred to neighbouring cells. The duration of the second stage is limited, in at least some embodiments, by the thermal conductivity and thickness of the casing or wall of the battery cell. Thus the duration will generally vary depending on the particular battery cell. This duration may be rate-limited by the physical properties of the battery cell, therefore merely applying more power will not necessarily speed up this process.

The present two stage approach may have one or more advantages over previous approaches, including reducing the amount of heat energy that gets transferred to neighbouring battery cells, due to the rapid temperature ramp up of the cell that simulates an internal short circuit event, ensuring with a higher degree of certainty that thermal runaway is initiated in the target battery cell by reducing the likelihood of the heat element failing due to the application of too much power ensuring the vast majority of heat is applied to the cell and not the surrounding environment.

Figure 16A:
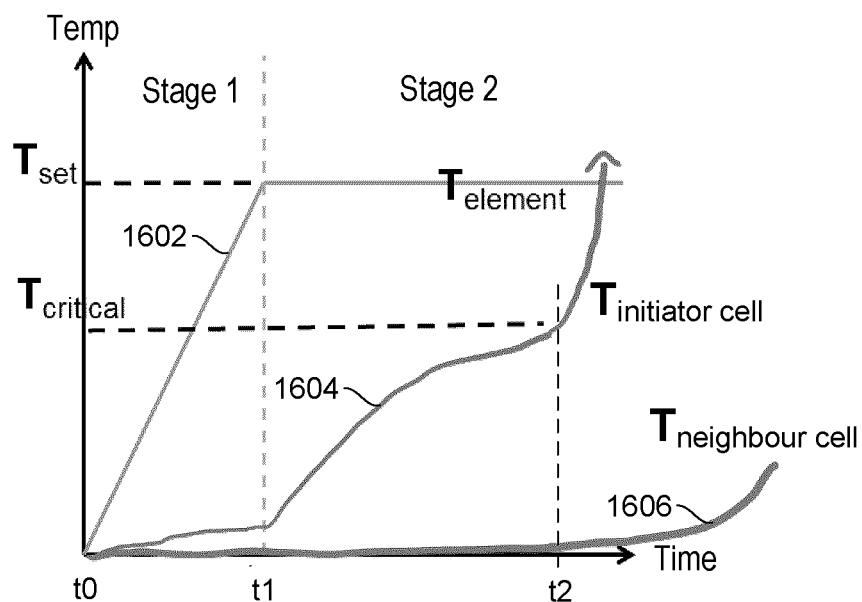
FIG. 16A is a graph of temperatures plotted against time to illustrate a two stage ramp and set approach according to the present disclosure.

FIG. 16A is an example graph of temperatures plotted against time according to the present disclosure to illustrate the two stage ramp and set approach. Line 1602 represents the temperature of a heating element ($T_{element}$) and line 1604 represents the temperature of a target battery cell ($T_{initiator\ cell}$). In the first stage, the heating element is rapidly heated to predetermined temperature $T_{set}$, which is above the critical temperature ($T_{critical}$) required to initiate thermal runaway in the cell. The first stage may start at time t0 and end at time t1, the duration of which may be up to 2 seconds, up to 3 seconds, or any other suitable value.

In the second stage, the temperature of the temperature of the heating element ($T_{element}$) is held more or less at the predetermined temperature $T_{set}$ until the temperature of a target battery cell ($T_{initiator\ cell}$) reaches the critical temperature ($T_{critical}$) and thermal runaway is initiated, which is shown occurring at time t2.

The time duration between times t0 and t1, the time duration between t1 and t2, and the critical temperature ($T_{critical}$) are generally all dependent on the physical and chemical properties of the target battery cell. Further, the time duration between times t0 and t1 also generally depends on the amount of power applied to the heating element.

The temperature of a closest neighbouring battery cell ($T_{neighbour\ cell}$) to the target battery cell is represented by line 1606. The temperature of the neighbour cell is shown as remaining very low relative to the temperatures of the heating element and the target battery cell.

Figure 16B:
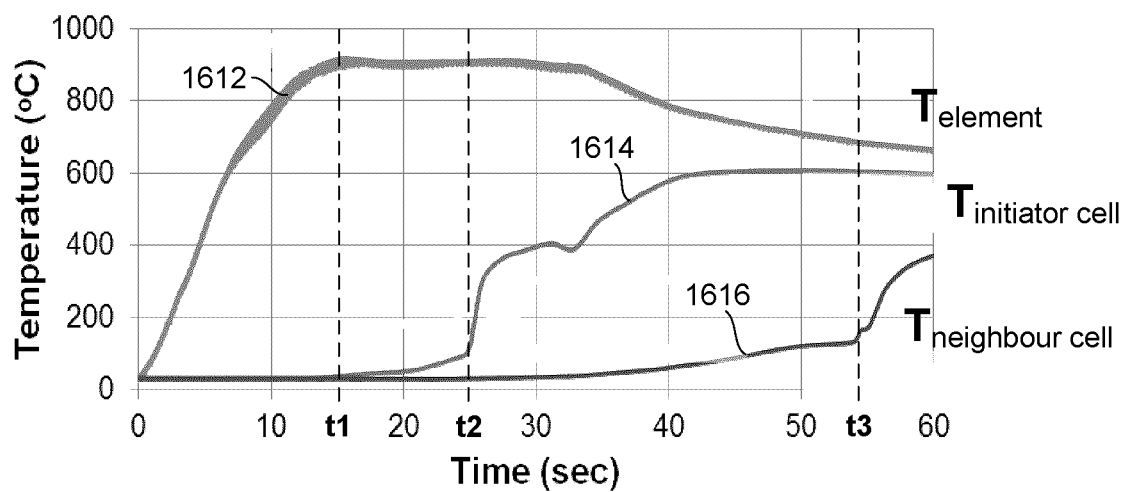
FIG. 16B is a graph of temperatures plotted against time from an experiment illustrating a two stage ramp and set approach.

FIG. 16B is a graph of temperatures plotted against time from an experiment illustrating a two stage ramp and set approach. This graph shows actual temperature and time values. For example, the heating element is heated from ambient temperature to approximately 900 degrees Celsius as shown from line 1612. The temperature of the battery cell, referred to as the initiator cell, climbs and reaches thermal runaway around time t2 and its temperature continues to climb as a result of thermal runaway as shown from line 1614. The temperature of a neighboring cell is shown represented by line 1616 and does not go into thermal runaway until t3, while maintaining its temperature below the critical thermal runaway temperature even when the initiator cell enters thermal runaway, meaning the period between times t2 and t3.

FIGS. 16A and B are provided as examples to illustrate the two stage approach for initiating thermal runaway. The line plots, temperature values, times, and other features of the graphs are examples only and are thus not meant to be limiting.

In an embodiment, an apparatus for initiating thermal runaway uses closed-loop control to control the temperature of the heating element by controlling the current to the heating element. The apparatus generally comprises a heating element, an energy source, a temperature sensor, and a temperature controller.

The heating element may be a resistive heating element or any other suitable type of heating element. The energy source may supply current or another form of energy to the heating element. The energy source may be a direct current (DC) power supply or any other suitable type of energy source. The temperature sensor senses the temperature of the resistive heating element. The temperature sensor may be a thermocouple or any other suitable sensing mechanism. The temperature controller causes the resistive heating element to be heated to a predetermined temperature and to be held at the predetermined temperature in response to the sensing of the temperature of the resistive heating element. In an embodiment, the temperature controller uses pulse-width-modulation (PWM) to control the power generated at the heating element. The temperature controller may control a relay to provide current to the heating element in response to the sensing of the temperature of the heating element. The relay may be a solid state relay or any other suitable type of relay.

Figure 17:
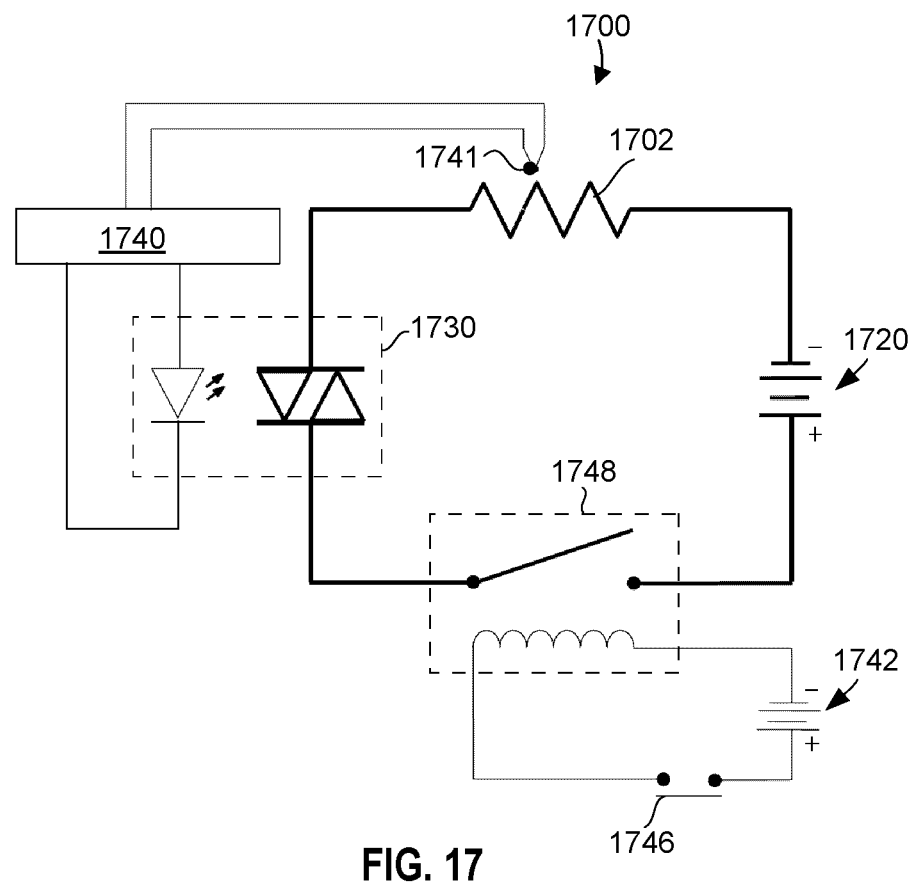
FIG. 17 is a schematic diagram of an apparatus for initiating thermal runaway according an embodiment of the present disclosure.

FIG. 17 a schematic diagram of an apparatus in the form of a circuit 1700 for initiating thermal runaway according an embodiment of the present disclosure. Circuit 1700 comprises a resistive heating element 1702 and an energy source 1720. Although embodiments herein are described as having a resistive heating element, some embodiments may have one or more other types of heating elements. In an embodiment, the energy source 1720 comprises a DC power supply, for example a 24 VDC supply.

The circuit 1700 may include control circuitry 1740 in the form of a temperature controller for controlling the transfer of energy from the energy source 1720 to the resistive heating element 1702. A temperature sensor 1741 is provided at the heating element 1702 and is communicatively coupled with temperature controller 1740.

Circuit 1700 also comprises an energy transfer switch or relay 1730 for selectively forming a circuit to electrically couple the energy source 1720 to heating element 1702. Energy transfer relay 1730, which is communicatively coupled to temperature controller 1740, is controlled by temperature controller 1740 to control the temperature of heating element 1702. Although energy transfer relay 1730 is shown as a solid state relay, other types of relays or switches may be used.

Circuit 1700 also comprises a circuit power relay 1748 for selectively forming a circuit to electrically couple the energy source 1720 to heating element 1702. Circuit power relay 1748 is shown as a single-pole, single throw electromechanical relay, although other types of relays or switching mechanisms may be used. Further, circuit power relay 1748 is shown being actuated with a trigger 1746. Circuit power relay 1748 may be powered by an energy source 1742 such as a DC power supply or battery.

As previously described, circuit 1700 is configured to selectively control the temperature of the resistive heating element to heat a region of the battery cell for initiating thermal runaway.

Figure 18:
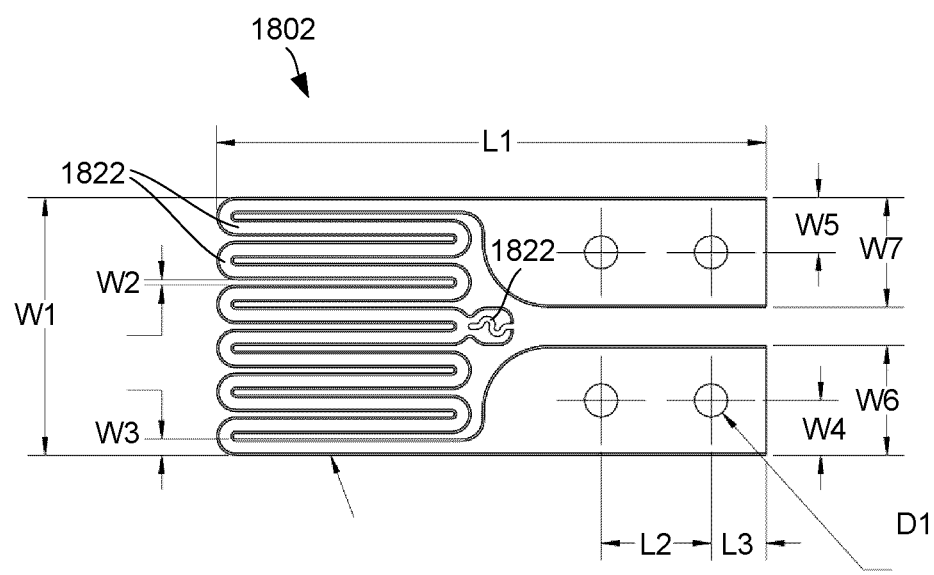
FIG. 18 is a representation of an embodiment of a resistive heating element.

FIG. 18 is a representation of an embodiment of a resistive heating element 1802. Heating element 1802 may be similar to other embodiments described herein but may also differ in one or more ways. For example, in an embodiment, element 1802 comprises nichrome (80/20). The edges (e.g. corners) of the meandering sub-elements 1822 may be chamfered, which may facilitate the application of an isolation barrier coating. In an embodiment, the chamfer may be approximately 2 mm×45 degrees. Further, heating element 1802 may include a channel or groove 1804 for facilitating the attachment of a temperature sensor (not shown) to the heating element 1802. Channel 1804 may be a serpentine shaped channel, as in the embodiment of FIG.

18, or may have any other suitable shape and size. In an embodiment, a channel having a serpentine shape allows the temperature sensor to be fixedly connected to the heating element and thus not dislodge during preparation and testing.

Further, the dimensions of heating element 1702 may have any suitable values. In an embodiment, the dimensions are approximately as follows: L1 is 50 mm, L2 is 10 mm, L3 is 5 mm, W1 is 23.5 mm, W2 is 0.5 mm, W3 is 1.5 mm, W4 and W5 are 5 mm, W6 and W7 are 10 mm, and D1 (diameter) is 3 mm.

Figure 19:
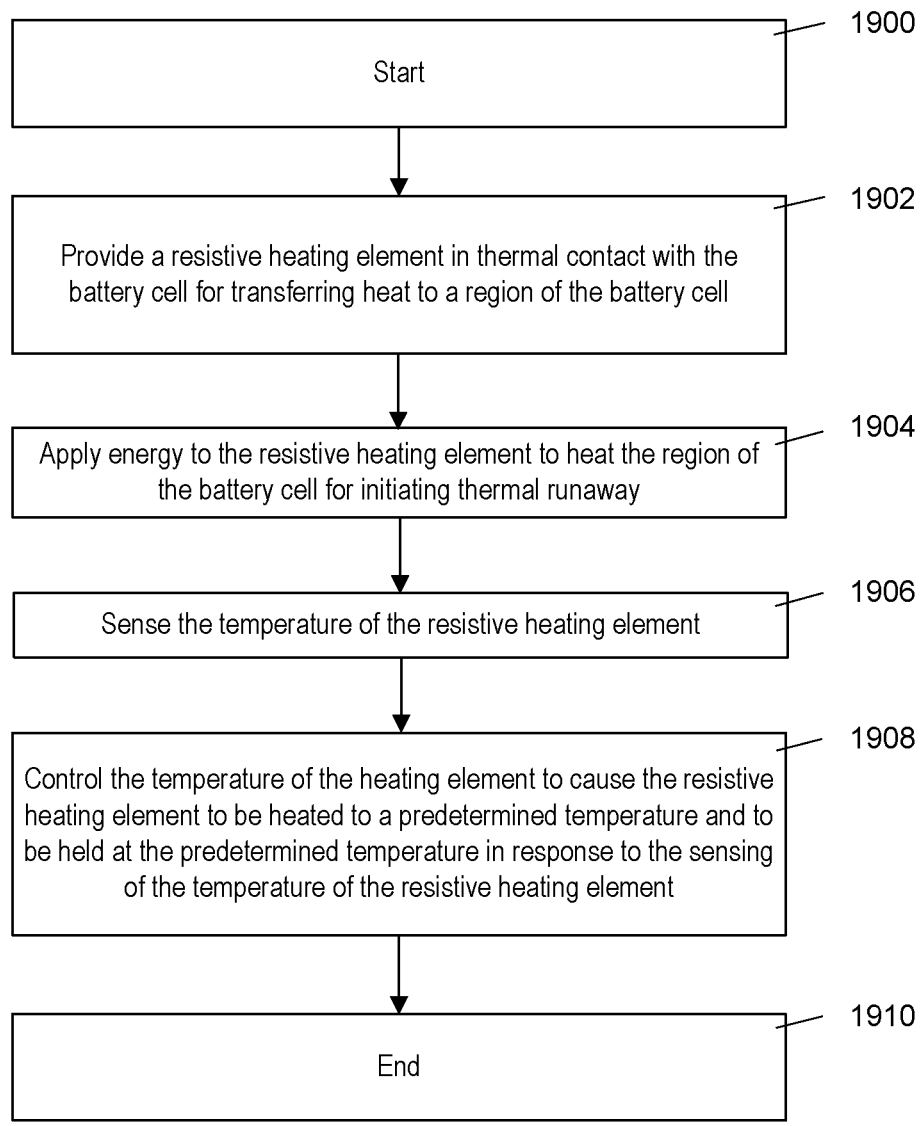
FIG. 19 is a process diagram for initiating thermal runaway in a battery cell in an embodiment according to the present disclosure.

FIG. 19 is a process diagram for initiating thermal runaway in a battery cell in an embodiment according to the present disclosure.

The process starts at block 1900 and proceeds to block 1902 where a resistive heating element is provided in thermal contact with the battery cell for transferring heat to a region of the battery cell.

The process proceeds to block 1904 where energy is applied to the resistive heating element to heat the region of the battery cell for initiating thermal runaway.

The process proceeds to block 1906 where the temperature of the resistive heating element is sensed.

The process proceeds to block 1908 where the temperature of the heating element is controlled to cause the resistive heating element to be heated to a predetermined temperature and to be held at the predetermined temperature in response to the sensing of the temperature of the resistive heating element The process proceeds to block 1910 and ends.

Figure 20:
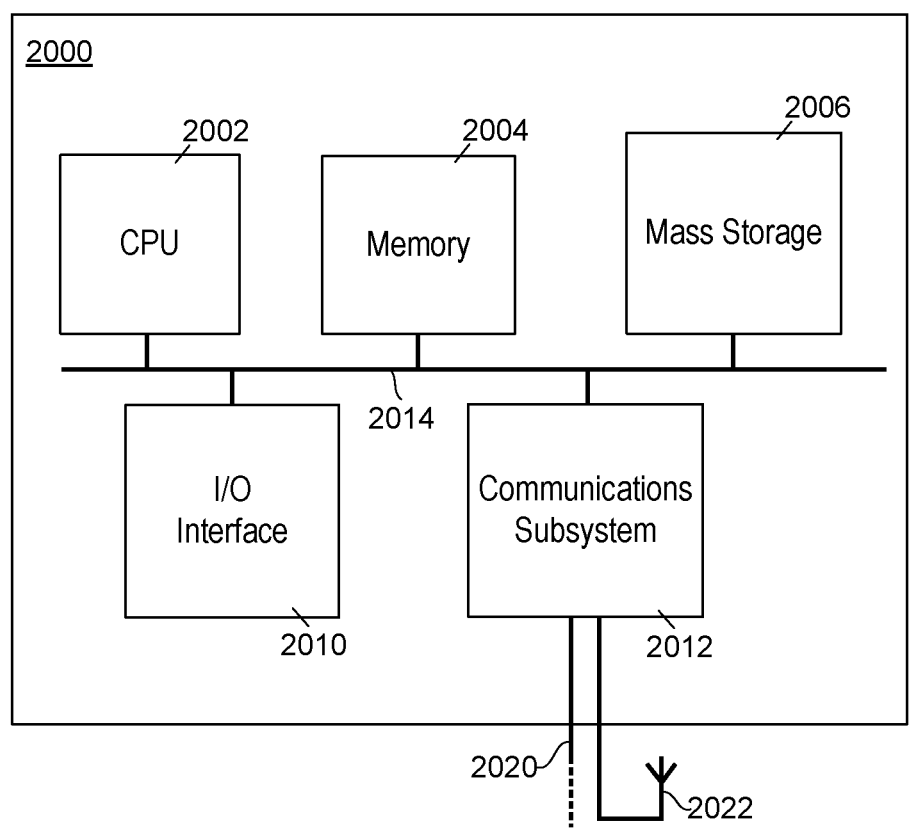
FIG. 20 is a block diagram of an example electronic device of an embodiment according to the present disclosure.

FIG. 20 is a block diagram of an example electronic device 2000 that may be used in implementing one or more aspects or components of an embodiment according to the present disclosure, including but not limited to an apparatus for initiating thermal runaway. In an embodiment, electronic device 2000 may be used to provide control and/or processing capabilities.

The electronic device 2000 may include one or more of a central processing unit (CPU) 2002, memory 2004, a mass storage device 2006, an input/output (I/O) interface 2010, and a communications subsystem 2012. One or more of the components or subsystems of electronic device 2000 may be interconnected by way of one or more buses 2014 or in any other suitable manner.

The bus 2014 may be one or more of any type of several bus architectures including a memory bus, storage bus, memory controller bus, peripheral bus, or the like. The CPU 2002 may comprise any type of electronic data processor, including without limitation an FPGA, a microprocessor and a microcontroller. A state machine may be substituted for CPU 2002 without exceeding the scope. The memory 2004 may comprise any type of system memory such as dynamic random access memory (DRAM), static random access memory (SRAM), synchronous DRAM (SDRAM), read-only memory (ROM), a combination thereof, or the like. In an embodiment, the memory may include ROM for use at boot-up, and DRAM for program and data storage for use while executing programs.

The mass storage device 2006 may comprise any type of storage device configured to store data, programs, and other information and to make the data, programs, and other information accessible via the bus 2014. The mass storage device 2006 may comprise one or more of a solid state drive (SSD), hard disk drive (HDD), a magnetic disk drive, an optical disk drive, or the like. In some embodiments, data, programs, or other information may be stored remotely, for example in the "cloud". Electronic device 2000 may send or receive information to the remote storage in any suitable way, including via communications subsystem 2012 over a network or other data communication medium.

The I/O interface 2010 may provide interfaces to couple one or more other devices (not shown) to the electronic device 2000. The other devices may include but are not limited to the energy transfer switch 548, the selecting switch, the control circuitry 540, the circuit 504, the energy source 520, the recharging system 530, energy transfer relay 1730, temperature sensor 1741, trigger 1746, and circuit power relay 1748 without limitation. Furthermore, additional or fewer interfaces may be utilized. For example, one or more serial interfaces such as Universal Serial Bus (USB) (not shown) may be provided.

A communications subsystem 2012 may be provided for one or both of transmitting and receiving signals. Communications subsystems may include any component or collection of components for enabling communications over one or more wired and wireless interfaces. These interfaces may include but are not limited to USB, Ethernet, high-definition multimedia interface (HDMI), Firewire (e.g. IEEE 1394), Thunderbolt™, WiFi™ (e.g. IEEE 802.11), WiMAX (e.g. IEEE 802.16), Bluetooth™, or Near-field communications (NFC), as well as GPRS, UMTS, LTE, LTE-A, dedicated short range communication (DSRC), and IEEE 802.11. Communication subsystem 2012 may include one or more ports or other components for one or more wired connections (not shown). Additionally or alternatively, communication subsystem 2012 may include one or more transmitters, receivers, and/or antenna elements (not shown).

The electronic device 2000 of FIG. 20 is merely an example and is not meant to be limiting. Various embodiments may utilize some or all of the components shown or described. Some embodiments may use other components not shown or described but known to persons skilled in the art. Also, the boundary of the electronic device 2000 in FIG. 20 is not meant to be limiting, meaning some components may be external to electronic device 2000 whereas other components may be internal.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented in software, hardware, firmware, or any combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The structure, features, accessories, and alternatives of specific embodiments described herein and shown in the Figures are intended to apply generally to all of the teachings of the present disclosure, including to all of the embodiments described and illustrated herein, insofar as they are compatible. In other words, the structure, features, accessories, and alternatives of a specific embodiment are not intended to be limited to only that specific embodiment unless so indicated.

In addition, the steps and the ordering of the steps of methods described herein are not meant to be limiting. Methods comprising different steps, different number of steps, and/or different ordering of steps are also contemplated.

The above-described embodiments are intended to be examples only. Alterations, modifications and variations can be effected to the particular embodiments by those of skill in the art without departing from the scope, which is defined solely by the claims appended hereto.

What is claimed is:

1. An apparatus for initiating thermal runaway in a battery cell, the apparatus comprising:
   a heating element for positioning in thermal contact with the battery cell for transferring heat to a region of the battery cell;
   heat transfer material positionable between and in contact with both the heating element and the battery cell for improving thermal energy transfer between the heating element and the battery cell;
   an energy source electrically coupled to the heating element; and
   a switch for selectively forming a circuit to send a current pulse through the heating element to generate a power pulse at the heating element to heat the region of the battery cell for initiating thermal runaway.

2. The apparatus of claim 1, wherein a peak heat flux density at the heating element generated by the power pulse is at least 800,000 watts per meter squared ($W/m^2$) where the power in watts is heating power at the heating element and the area in meters squared is a footprint surface area of the heating element.

3. The apparatus of claim 1, wherein the footprint surface area of the heating element is no more than 20% of the total external surface area of a casing of the battery cell.

4. The apparatus of claim 1, wherein a ratio of a peak heating power in kilowatts (kW) at the heating element during the discharge of the energy source to a standard 1C C-rate constant current discharge cycle power in kW of the battery cell is at least 50 to 1, wherein C-rate is a measure of the rate at which a battery is discharged relative to its maximum capacity.

5. The apparatus of claim 1, wherein a ratio of the heat energy in kilojoules (kJ) dissipated by the heating element during the discharge of the energy source to the energy storage capacity (kJ) of the battery cell is less than 10%.

6. The apparatus of claim 1, further comprising an electrical isolation barrier coating external to the heating element to electrically isolate the heating element.

7. The apparatus of claim 6, further comprising a heat conducting metal based coating external to the electrical isolation barrier coating.

8. The apparatus of claim 1, wherein the heating element is pliable allowing its shape to be modified to correspond to an external surface of the battery cell.

9. The apparatus of claim 1, wherein the heating element has a thickness of no more than 5 millimeters.

10. A method for initiating thermal runaway in a battery cell, the method comprising:
    providing a heating element in thermal contact with the battery cell for transferring heat to a region of the battery cell;
    providing heat transfer material between and in contact with both the heating element and the battery cell for improving thermal energy transfer between the heating element and the battery cell;
    providing an energy source electrically coupled to the heating element; and
    sending a current pulse through the heating element to generate a power pulse at the heating element to heat the region of the battery cell for initiating thermal runaway.

11. The method of claim 10, wherein the power pulse generates a peak heat flux density at the heating element of at least 800,000 watts per meter squared ($W/m^2$) where the power in watts is heating power at the heating element and the area in meters squared is a footprint surface area of the heating element.

12. The method of claim 10, wherein a ratio of a peak heating power in kilowatts (kW) at the heating element during the discharge of the energy source to a standard 1C C-rate constant current discharge cycle power in kW of the battery cell is at least 50 to 1, wherein C-rate is a measure of the rate at which a battery is discharged relative to its maximum capacity.

13. The method of claim 10, wherein a ratio of the heat energy in kilojoules (kJ) dissipated by the heating element during the discharge of the energy source to the energy storage capacity (kJ) of the battery cell is less than 10%.

14. An apparatus for initiating thermal runaway in a battery cell, the apparatus comprising:
    means for converting electrical energy into heat positionable in thermal contact with the battery cell for transferring heat to a region of the battery cell;
    heat transfer material positionable between and in contact with both the means for converting electrical energy into heat and the battery cell for improving thermal energy transfer between the means for converting electrical energy into heat and the battery cell;
    means for providing energy electrically coupled to the means for converting electrical energy into heat;
    switching means for selectively sending a current pulse to the means for converting electrical energy into heat to generate a power pulse at the means for converting electrical energy into heat to heat the region of the battery cell for initiating thermal runaway.

15. The apparatus of claim 1, wherein the apparatus further comprises:
    a temperature sensor for sensing the temperature of the heating element; and
    a temperature controller communicatively coupled with the temperature sensor,
    wherein the temperature controller is configured to operate the switch to cause energy to be released from the energy source and generate power at the heating element to heat the region of the battery cell for initiating thermal runaway,
    and wherein the temperature controller is further configured to cause the heating element to be heated to a predetermined temperature and to be held at the predetermined temperature in response to the sensing of the temperature of the heating element.

16. The apparatus of claim 15, wherein a peak heat flux density at the heating element generated by the generated power is at least 800,000 watts per meter squared (W/m$^2$) where the power in watts is heating power at the heating element and the area in meters squared is a footprint surface area of the heating element.

17. The apparatus of claim 15, wherein the temperature controller is configured to use pulse-width-modulation (PWM) to control the power generated at the heating element.

18. The apparatus of claim 15, wherein the temperature controller prevents the temperature of the heating element from exceeding the predetermined temperature by more than 5% in response to the energy released from the energy source.

19. The method of claim 10, further comprising:
sensing the temperature of the heating element; and
controlling the temperature of the heating element such that the heating element is heated to a predetermined temperature and is held at the predetermined temperature in response to the sensing of the temperature of the heating element.

20. The method of claim 19, wherein power generated at the heating element produces a peak heat flux density at the heating element of at least 800,000 watts per meter squared (W/m2) where the power in watts is heating power at the heating element and the area in meters squared is a footprint surface area of the heating element.

21. The method of claim 19, wherein the controlling uses pulse-width-modulation (PWM) to control the temperature of the heating element.

22. The method of claim 19, wherein the controlling comprises preventing the temperature of the heating element from exceeding the predetermined temperature by more than 5% in response to the energy released from the energy source.

23. The apparatus of claim 1, wherein the heating element is a resistive heating element.

24. The apparatus of claim 1, wherein the heat transfer material comprises a conductive heat transfer paste.

25. The method of claim 10, wherein the heat transfer material comprises a conductive heat transfer paste.

\* \* \* \* \*